US008576636B2

(12) United States Patent
Kato et al.

(10) Patent No.: US 8,576,636 B2
(45) Date of Patent: Nov. 5, 2013

(54) SEMICONDUCTOR DEVICE

(75) Inventors: Kiyoshi Kato, Kanagawa (JP); Takanori Matsuzaki, Kanagawa (JP); Hiroki Inoue, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 199 days.

(21) Appl. No.: 13/175,090

(22) Filed: Jul. 1, 2011

(65) Prior Publication Data

US 2012/0014157 A1    Jan. 19, 2012

(30) Foreign Application Priority Data

Jul. 16, 2010   (JP) ................................. 2010-162219

(51) Int. Cl.
*G11C 11/34*  (2006.01)
(52) U.S. Cl.
USPC ............................ 365/187; 365/145; 365/149
(58) Field of Classification Search
USPC .................. 365/187, 149, 145; 257/296, 306
See application file for complete search history.

(56) References Cited

U.S. PATENT DOCUMENTS

| 4,466,081 | A | 8/1984 | Masuoka |
| 5,731,856 | A | 3/1998 | Kim et al. |
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,445,026 | B1 | 9/2002 | Kubota et al. |
| 6,519,195 | B2 | 2/2003 | Kanno et al. |
| 6,563,174 | B2 | 5/2003 | Kawasaki et al. |
| 6,614,696 | B2* | 9/2003 | Kanno et al. .................. 365/187 |
| 6,727,522 | B1 | 4/2004 | Kawasaki et al. |
| 6,829,186 | B2* | 12/2004 | Kanno et al. .................. 365/203 |
| 6,888,770 | B2 | 5/2005 | Ikehashi |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |

(Continued)

FOREIGN PATENT DOCUMENTS

| CN | 101258607 A | 9/2008 |
| CN | 101859711 A | 10/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Gene Auduong
(74) *Attorney, Agent, or Firm* — Fish & Richardson P.C.

(57) ABSTRACT

A plurality of memory cells included in a memory cell array are divided into a plurality of blocks every plural rows. A common bit line is electrically connected to the divided bit lines through selection transistors in the blocks. One of the memory cells includes a first transistor, a second transistor, and a capacitor. The first transistor includes a first channel formation region. The second transistor includes a second channel formation region. The first channel formation region includes a semiconductor material different from the semiconductor material of the second channel formation region.

15 Claims, 13 Drawing Sheets

(56) References Cited

U.S. PATENT DOCUMENTS

| | | | |
|---|---|---|---|
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 * | 6/2010 | Akimoto et al. | 257/72 |
| 7,791,074 B2 | 9/2010 | Iwasaki |
| 7,935,582 B2 | 5/2011 | Iwasaki |
| 7,956,361 B2 | 6/2011 | Iwasaki |
| 2001/0046027 A1 | 11/2001 | Tai et al. |
| 2001/0048617 A1 | 12/2001 | Kanno et al. |
| 2002/0056838 A1 | 5/2002 | Ogawa |
| 2002/0132454 A1 | 9/2002 | Ohtsu et al. |
| 2003/0090948 A1 | 5/2003 | Kanno et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0057311 A1 | 3/2004 | Kanno et al. |
| 2004/0127038 A1 | 7/2004 | Carcia et al. |
| 2004/0223392 A1 | 11/2004 | Ikehashi |
| 2005/0017302 A1 | 1/2005 | Hoffman |
| 2005/0088886 A1 | 4/2005 | Kanno et al. |
| 2005/0128803 A1 * | 6/2005 | Luk et al. | 365/175 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0276689 A1 | 11/2010 | Iwasaki |
| 2010/0279462 A1 | 11/2010 | Iwasaki |
| 2011/0101332 A1 | 5/2011 | Yamazaki et al. |
| 2011/0101351 A1 | 5/2011 | Yamazaki |
| 2011/0193082 A1 | 8/2011 | Iwasaki |

FOREIGN PATENT DOCUMENTS

| | | |
|---|---|---|
| EP | 1 737 044 A1 | 12/2006 |
| EP | 2 226 847 A2 | 9/2010 |
| EP | 2 339 639 A2 | 6/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-044297 A | 2/2001 |
| JP | 2001-053165 A | 2/2001 |
| JP | 2001-291389 A | 10/2001 |
| JP | 2002-076356 A | 3/2002 |
| JP | 2002-093924 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-335031 A | 11/2004 |
| JP | 2007-042172 A | 2/2007 |
| JP | 2007-103918 A | 4/2007 |
| JP | 2010-183108 A | 8/2010 |
| KR | 2001-0015476 A | 2/2001 |
| KR | 2001-0094995 A | 11/2001 |
| KR | 2008-0053355 A | 6/2008 |
| WO | 2004/114391 A1 | 12/2004 |
| WO | 2007/029844 A1 | 3/2007 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO2(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report, PCT Application No. PCT/JP2011/064599, dated Sep. 27, 2011, 4 pages.

Written Opinion, PCT Application No. PCT/JP2011/064599, dated Sep. 27, 2011, 4 pages.

* cited by examiner

SEMICONDUCTOR DEVICE

TECHNICAL FIELD

The disclosed invention relates to semiconductor devices including semiconductor elements and methods for manufacturing the semiconductor devices.

BACKGROUND ART

Memory devices including semiconductor elements are broadly classified into two categories: volatile memory devices that lose stored data when power is not supplied and non-volatile memory devices that retains stored data even when power is not supplied.

A typical example of a volatile memory device is a DRAM (dynamic random access memory). A DRAM stores data in such a manner that a transistor included in a memory element is selected and electrical charge is accumulated in a capacitor.

When data is read from a DRAM, electrical charge in a capacitor is lost according to the principle; thus, another writing operation is necessary every time data is read. Further, a transistor included in a memory element has leakage current (off-state current) between a source and a drain in an off state or the like and electrical charge flows into or out even if the transistor is not selected, so that a data retention period is short. For that reason, another writing operation (refresh operation) is necessary at predetermined intervals, and it is difficult to sufficiently reduce power consumption. Furthermore, since stored data is lost when power is not supplied, a different memory device using a magnetic material or an optical material is needed in order to retain data for a long time.

A different example of a volatile memory device is an SRAM (static random access memory). An SRAM retains stored data by using a circuit such as a flip-flop and thus does not need refresh operation, which is an advantage over a DRAM. However, cost per storage capacity is high because a circuit such as a flip-flop is used. Further, as in a DRAM, stored data in an SRAM is lost when power is not supplied.

A typical example of a non-volatile memory device is a flash memory. A flash memory includes a floating gate between a gate electrode and a channel formation region in a transistor and stores data by holding electrical charge in the floating gate. Thus, a flash memory has advantages in that a data retention period is extremely long (semi-permanent) and refresh operation which is necessary in a volatile memory device is not needed (for example, see Reference 1).

However, there is a problem in that a memory element does not function after a number of writing operations because a gate insulating layer included in the memory element deteriorates due to tunneling current generated in writing operations. In order to avoid this problem, a method by which the number of writing operations is equalized among memory elements is employed, for example. However, complex peripheral circuit is needed to realize this method. Further, even when such a method is employed, the fundamental problem of lifetime cannot be solved. That is, a flash memory is not suitable for applications in which data is frequently rewritten.

In addition, high voltage is necessary in order to inject electrical charge into a floating gate or to remove the electrical charge, and a circuit for generating high voltage is required. Further, it takes a comparatively long time to inject or remove electrical charge, and it is not easy to increase the speed of writing or erasing data.

REFERENCE

Reference 1: Japanese Published Patent Application No. 57-105889

DISCLOSURE OF INVENTION

In view of the problems, it is an object of one embodiment of the disclosed invention to provide a semiconductor device with a novel structure in which stored data can be retained even when power is not supplied, and does not have a limitation on the number of writing.

In the disclosed invention, a semiconductor device is formed using a highly-purified oxide semiconductor. A transistor formed using a highly-purified oxide semiconductor can retain data for a long time because leakage current thereof is extremely low.

Specifically, structures described below can be employed, for example.

One embodiment of the present invention is a semiconductor device that includes a common bit line, a plurality of divided bit lines electrically connected to the common bit line, a source line, a word line, a signal line, a selection line, a selection transistor whose gate electrode is electrically connected to the selection line, and a memory cell array including a plurality of memory cells. The plurality of memory cells included in the memory cell array are divided into a plurality of blocks every plural rows. The common bit line is electrically connected to the divided bit lines through the selection transistors in the blocks. One of the memory cells includes a first transistor, a second transistor, and a capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region includes a semiconductor material that is different from a semiconductor material of the second channel formation region. The source line is electrically connected to the first source electrode. The divided bit line is electrically connected to the first drain electrode and the second source electrode. The word line is electrically connected to one electrode of the capacitor. The signal line is electrically connected to the second gate electrode. The first gate electrode, the second drain electrode, and the other electrode of the capacitor are electrically connected to each other and form a node in which electrical charge is stored.

Another embodiment of the present invention is a semiconductor device that includes a common bit line, a plurality of divided bit lines electrically connected to the common bit line, a source line, a word line, a first signal line, a second signal line, a selection line, a selection transistor whose gate electrode is electrically connected to the selection line, and a memory cell array including a plurality of memory cells. The plurality of memory cells included in the memory cell array are divided into a plurality of blocks every plural rows. The common bit line is electrically connected to the divided bit lines through the selection transistors in the blocks. One of the memory cells includes a first transistor, a second transistor, and a capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region includes a semiconductor material that is different from a semiconductor material of the second channel formation region. The source line is electrically connected to the first source electrode. The divided bit line is electrically connected to the first drain electrode. The word line is electrically connected to one electrode of the capacitor. The first signal line is electrically connected to the second gate electrode. The second signal line is electrically connected to the second source electrode. The first gate electrode, the second drain electrode, and the other electrode of the capacitor are electrically connected to each other and form a node in which electrical charge is stored.

In the semiconductor device, the second channel formation region of the second transistor preferably includes an oxide semiconductor. In addition, in the semiconductor device, the first channel formation region of the first transistor preferably includes single crystal silicon. Further, in the semiconductor device, a channel formation region of the selection transistor preferably includes single crystal silicon.

Note that although the transistor is formed using an oxide semiconductor material in the above, the disclosed invention is not limited to this. A material which can realize off-current characteristics equivalent to those of the oxide semiconductor material, for example, a wide-gap material such as silicon carbide (specifically, for example, a semiconductor material whose energy gap $E_g$ is more than 3 eV) may be used.

Note that in this specification and the like, a term such as "over" or "below" does not necessarily mean that a component is placed "directly on" or "directly under" another component. For example, the expression "a gate electrode over a gate insulating layer" does not exclude the case where another component is placed between the gate insulating layer and the gate electrode. Further, the twins such as "over" and "below" are only used for convenience of descriptions.

In addition, in this specification and the like, terms such as "electrode" and "wiring" do not limit the functions of components. For example, an "electrode" can be used as part of a "wiring", and the "wiring" can be used as part of the "electrode". The terms such as "electrode" and "wiring" can also mean a combination of a plurality of "electrodes" and "wirings", for example.

Note that a "source electrode", a "drain electrode", and a "gate electrode" may be simply referred to as a "source", a "drain", and a "gate", respectively. Functions of a "source" and a "drain" might interchange when a transistor of opposite polarity is used or the direction of current flow is changed in circuit operation, for example. Thus, in this specification, the terms "source" and "drain" can interchange.

Since the off-state current of a transistor including an oxide semiconductor is extremely low, stored data can be retained for an extremely long time with the use of the transistor. In other words, refresh operation is not needed or the frequency of the refresh operation can be extremely decreased, which leads to a sufficient reduction in power consumption. Further, stored data can be retained for a long time even when power is not supplied.

Further, a semiconductor device according to the disclosed invention does not need high voltage for writing data and does not have the problem of deterioration of elements. For example, unlike a conventional non-volatile memory, it is not necessary to inject and extract electrons into and from a floating gate; thus, the problem of deterioration of a gate insulating layer does not occur. In other words, the semiconductor device according to the disclosed invention does not have the limitation on the number of writing, which is a problem of a conventional non-volatile memory, and reliability thereof is markedly improved. Furthermore, data is written depending on the on and off of the transistor, so that high-speed operation can be easily realized. Additionally, there is an advantage that operation for erasing data is not needed.

Since a transistor including a material other than an oxide semiconductor can operate at sufficiently high speed, a semiconductor device can perform operation (e.g., data reading) at sufficiently high speed in combination of a transistor including an oxide semiconductor. Further, a transistor including a material other than an oxide semiconductor can favorably realize a variety of circuits (e.g., a logic circuit or a driver circuit) which need to operate at high speed.

A semiconductor device having a novel feature can be realized by provision of both the transistor including a material other than an oxide semiconductor (in a broader sense, a transistor capable of operating at sufficiently high speed) and the transistor including an oxide semiconductor (in a broader sense, a transistor whose off-state current is sufficiently low).

In addition, in one embodiment of the disclosed invention, a bit line is divided through selection transistors in each block of a memory cell array, so that the power consumption of a semiconductor device can be reduced. Further, the data read performance of the semiconductor device can be improved.

BRIEF DESCRIPTION OF DRAWINGS

In the accompanying drawings:

FIG. 2 is a circuit diagram of a semiconductor device;

BEST MODE FOR CARRYING OUT THE INVENTION

Figures 1, 1A:
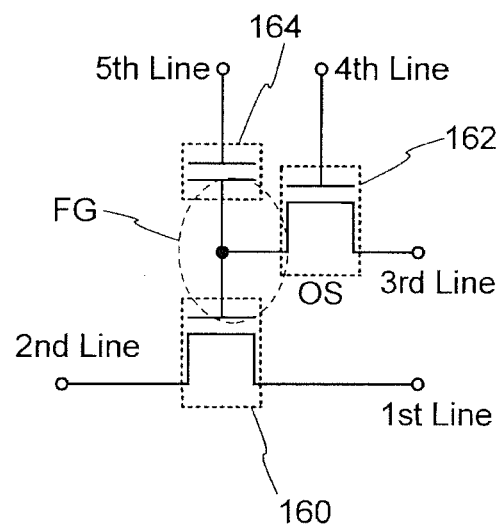
FIGS. 1A-1 and 1A-2 are circuit diagrams of a semiconductor device.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number.

(Embodiment 1)

In this embodiment, circuit structures and operation of semiconductor devices in one embodiment of the disclosed invention are described with reference to FIGS. 1A-1 and 1A-2, FIG. 2, FIG. 3, and FIG. 4. Note that in some circuit diagrams, "OS" is written beside a transistor in order to indicate that the transistor includes an oxide semiconductor.

<Basic Circuit>

First, a basic circuit structure and operation of the circuit are described with reference to FIGS. 1A-1 and 1A-2. In the semiconductor device illustrated in FIG. 1A-1, a first wiring (1st Line) and a source electrode of a transistor 160 are electrically connected to each other, and a second wiring (2nd Line) and a drain electrode of the transistor 160 are electrically connected to each other. In addition, a third wiring (3rd Line) and a source electrode (or a drain electrode) of a transistor 162 are electrically connected to each other, and a fourth wiring (4th Line) and a gate electrode of the transistor 162 are electrically connected to each other. Further, a gate electrode of the transistor 160 and the drain electrode (or the source electrode) of the transistor 162 are electrically connected to one electrode of a capacitor 164, and a fifth wiring (5th Line) and the other electrode of the capacitor 164 are electrically connected to each other.

Here, a transistor including an oxide semiconductor is used as the transistor 162, for example. The off-state current of a transistor including an oxide semiconductor is extremely low. Thus, when the transistor 162 is turned off, the potential of the gate electrode of the transistor 160 can be held for an extremely long time. Provision of the capacitor 164 facilitates storage of electrical charge given to the gate electrode of the transistor 160 and reading of stored data.

Note that there is no particular limitation on the transistor 160. In order to increase the speed of reading data, it is preferable to use, for example, a transistor with high switching speed, such as a transistor formed using single crystal silicon.

The semiconductor device illustrated in FIG. 1A-1 can write, retain, and read data as described below, utilizing a feature in which the potential of the gate electrode of the transistor 160 can be held.

First, data writing and data retention are described. First, the potential of the fourth wiring is set to a potential at which the transistor 162 is turned on, so that the transistor 162 is turned on. Thus, the potential of the third wiring is applied to the gate electrode of the transistor 160 and the capacitor 164. That is, predetermined electrical charge is given to the gate electrode of the transistor 160 (writing). Here, one of electrical charges for supply of two different potentials (hereinafter, an electrical charge for supply of a low potential is referred to as an electrical charge $Q_L$ and an electrical charge for supply of a high potential is referred to as an electrical charge $Q_H$) is given to the gate electrode of the transistor 160. Note that electrical charges giving three or more different potentials may be applied to improve storage capacity. After that, the potential of the fourth wiring is set to a potential at which the transistor 162 is turned off, so that the transistor 162 is turned off. Thus, the electrical charge given to the gate electrode of the transistor 160 is stored (retention).

Since the off-state current of the transistor 162 is extremely low, the electrical charge of the gate electrode of the transistor 160 is stored for a long time.

Next, data reading is described. When an appropriate potential (a reading potential) is applied to the fifth wiring while a predetermined potential (a constant potential) is applied to the first wiring, the potential of the second wiring varies depending on the amount of electrical charge stored in the gate electrode of the transistor 160. This is generally because, when the transistor 160 is an n-channel transistor, the apparent threshold voltage $V_{th\_H}$ at the time when the electrical charge $Q_H$ is given to the gate electrode of the transistor 160 is lower than the apparent threshold voltage $V_{th\_L}$ at the time when the electrical charge $Q_L$ is given to the gate electrode of the transistor 160. Here, the apparent threshold voltage is the potential of the fifth wiring that is needed to turn on the transistor 160. Thus, the potential of the fifth wiring is set to a potential $V_0$ that is intermediate between $V_{th\_H}$ and $V_{th\_L}$, so that electrical charge given to the gate electrode of the transistor 160 can be determined. For example, in the case where the electrical charge $Q_H$ is given in writing, when the potential of the fifth wiring is set to $V_0$ (>$V_{th\_H}$), the transistor 160 is turned on. In the case where the electrical charge $Q_L$ is given in writing, even when the potential of the fifth wiring is set to $V_0$ (<$V_{th\_L}$), the transistor 160 is kept off. Accordingly, a different potential is applied to the second wiring, and stored data can be read when the potential of the second wiring is measured.

Note that in the case where memory cells are arrayed, it is necessary that data of only a desired memory cell can be read. In order to read data of a predetermined memory cell and not to read data of the other memory cells in this manner, in the case where the transistors 160 are connected in parallel, fifth wirings in memory cells that are not a target for reading are supplied with a potential at which the transistors 160 are turned off regardless of the states of the gate electrodes, that is, a potential that is lower than $V_{th\_H}$. In the case where the transistors 160 are connected in series, the fifth wirings are supplied with a potential at which the transistors 160 are turned on regardless of the states of the gate electrodes, that is, a potential that is higher than $V_{th\_L}$.

Next, data rewriting is described. Data rewriting is performed in a manner similar to those of the data writing and the data retention. That is, the potential of the fourth wiring is set to a potential at which the transistor 162 is turned on, so that the transistor 162 is turned on. Thus, the potential of the third wiring (a potential related to new data) is applied to the gate electrode of the transistor 160 and the capacitor 164. After that, the potential of the fourth wiring is set to a potential at which the transistor 162 is turned off, so that the transistor 162 is turned off. Accordingly, electrical charge related to the new data is given to the gate electrode of the transistor 160.

In the semiconductor device according to the disclosed invention, data can be directly rewritten by another data writing as described above. Thus, extraction of electrical charge from a floating gate with the use of high voltage needed in a flash memory or the like is not necessary, so that the decrease in operation speed due to erasing operation can be suppressed. That is, the semiconductor device can operate at high speed.

Note that the drain electrode (or the source electrode) of the transistor 162 is electrically connected to the gate electrode of the transistor 160, so that it has a function similar to that of a floating gate of a floating-gate transistor which is used as a non-volatile memory element. Thus, a portion in the drawing where the drain electrode (or the source electrode) of the transistor 162 is electrically connected to the gate electrode of the transistor 160 is called a floating gate portion FG in some cases. When the transistor 162 is off, the floating gate portion FG can be regarded as being embedded in an insulator and electrical charge is stored in the floating gate portion FG. The amount of off-state current of the transistor 162 including an oxide semiconductor is smaller than or equal to one hundred thousandth of the amount of off-state current of a transistor including a silicon semiconductor; thus, loss of the electrical charge accumulated in the floating gate portion FG due to the leakage current of the transistor 162 is negligible. In other words, with the transistor 162 including an oxide semiconductor, a non-volatile memory device which can retain data without supply of power can be realized.

For example, when the off-state current of the transistor 162 is 10 zA (1 zA (zeptoampere) is $1 \times 10^{-21}$ A) or less at room temperature (25° C.) and the capacitance value of the capacitor 164 is approximately 10 fF, data can be retained for $10^4$ s or longer. Note that it is needless to say that the retention time depends on transistor characteristics and the capacitance value.

Further, in that case, the problem of deterioration of a gate insulating film (a tunnel insulating film), which is pointed out in a conventional floating gate transistor, does not exist. That is, the deterioration of a gate insulating film due to injection of electrons into a floating gate, which is a conventional problem, can be solved. This means that there is no limitation on the number of writing in principle. Further, high voltage needed for writing or erasing data in a conventional floating gate transistor is not necessary.

Figures 1, 1A, 2:
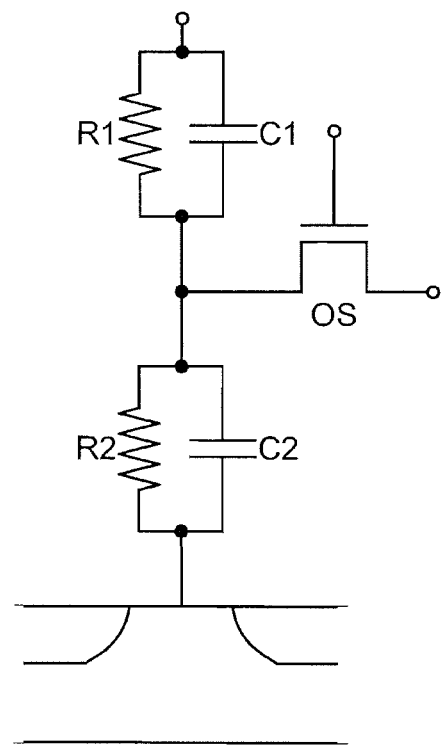
Figure 2:
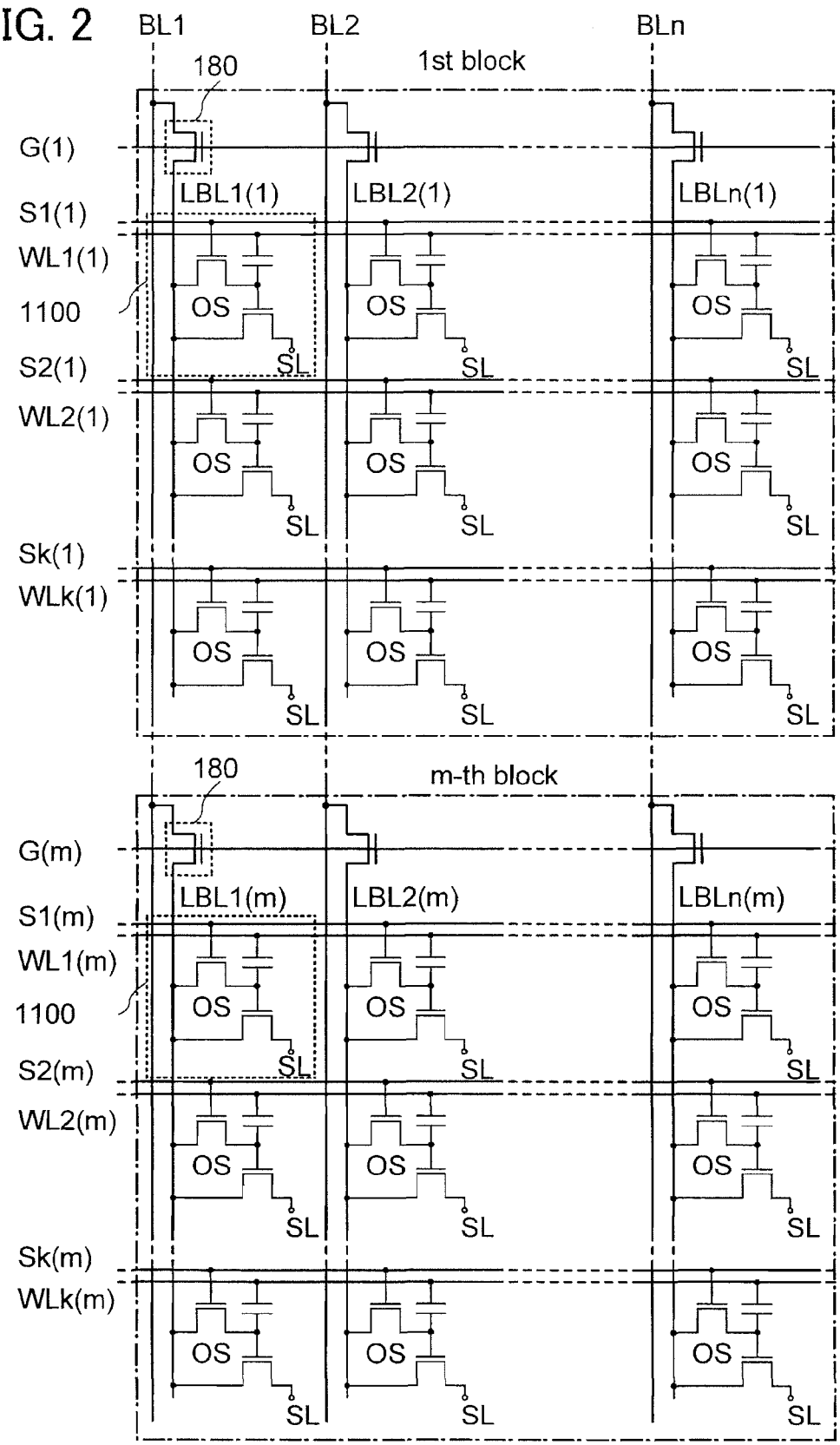

Components such as transistors in the semiconductor device illustrated in FIG. 1A-1 can be regarded as including a resistor and a capacitor as illustrated in FIG. 1A-2. That is, in FIG. 1A-2, the transistor 160 and the capacitor 164 are each regarded as including a resistor and a capacitor. R1 and C1 denote the resistance and the capacitance of the capacitor 164, respectively. The resistance R1 corresponds to the resistance of an insulating layer included in the capacitor 164. R2 and C2 denote the resistance and the capacitance of the transistor 160, respectively. The resistance R2 corresponds to the resistance of a gate insulating layer at the time when the transistor 160 is on. The capacitance C2 corresponds to so-called gate capacitance (capacitance formed between the gate electrode and the source electrode or the drain electrode and capacitance formed between the gate electrode and a channel formation region).

An electrical charge storing period (also referred to as a data retention period) is determined mainly by the off-state current of the transistor 162 under the conditions that the gate leakage of the transistor 162 is sufficiently small and that R1≥ROS and R2≥ROS are satisfied, where the resistance (also referred to as effective resistance) between the source electrode and the drain electrode at the time when the transistor 162 is off is ROS.

In contrast, when the conditions are not satisfied, it is difficult to sufficiently secure the storing period even if the off-state current of the transistor 162 is low enough. This is because leakage current other than the off-state current of the transistor 162 (e.g., leakage current generated between the source electrode and the gate electrode) is high. Thus, it can be said that the semiconductor device disclosed in this embodiment preferably satisfies the above relation.

It is preferable that C1≥C2 be satisfied. This is because when C1 is large, the potential of the fifth wiring can be applied to the floating gate portion FG efficiently at the time of controlling the potential of the floating gate portion FG by the fifth wiring, and a difference between potentials (e.g., the reading potential and a non-reading potential) applied to the fifth wiring can be reduced.

When the above relation is satisfied, a more favorable semiconductor device can be realized. Note that R1 and R2 are controlled by the gate insulating layer of the transistor 160 and the insulating layer of the capacitor 164. The same relation is applied to C1 and C2. Thus, the material, the thickness, and the like of the gate insulating layer are preferably set as appropriate so that the above relation is satisfied.

In the semiconductor device described in this embodiment, the floating gate portion FG has a function similar to that of a floating gate of a floating gate transistor in a flash memory or the like, but the floating gate portion FG of this embodiment has a feature which is essentially different from that of a floating gate in a flash memory or the like. In the case of a flash memory, since voltage applied to a control gate is high, it is necessary to keep a proper distance between cells in order to prevent the potential from affecting a floating gate of an adjacent cell. This is one of the factors inhibiting high integration of the semiconductor device. The factor is due to the basic principle of a flash memory: tunneling current is generated by application of a high electric field.

In contrast, the semiconductor device of this embodiment is operated by switching of a transistor including an oxide semiconductor and does not use the principle of electrical charge injection by tunneling current. That is, unlike a flash memory, a high electric field for electrical charge injection is not necessary. Accordingly, it is not necessary to consider the influence of a high electric field from a control gate on an adjacent cell, which facilitates high integration.

In addition, the semiconductor device of this embodiment is advantageous over a flash memory also in that a high electric field is not necessary and that a large peripheral circuit (e.g., a step-up circuit (a step-up DC-DC converter)) is not necessary. For example, the highest voltage applied to the memory cell of this embodiment (the difference between the highest potential and the lowest potential applied to terminals of the memory cell at the same time) can be 5 V or lower, preferably 3 V or lower in one memory cell in the case where two levels (one bit) of data are written.

In the case where the relative dielectric constant $\in$r1 of the insulating layer included in the capacitor 164 is different from the relative dielectric constant $\in$r2 of the insulating layer included in the transistor 160, it is easy to satisfy C1≥C2 while 2×S2≥S1 (preferably S2≥S1) is satisfied, where S1 is the area of the insulating layer included in the capacitor 164 and S2 is the area of the insulating layer forming gate capacitance in the transistor 160. That is, it is easy to satisfy C1≥C2 while the area of the insulating layer included in the capacitor 164 is made small. Specifically, for example, a film formed using a high-k material such as hafnium oxide or a stack of a film formed using a high-k material such as hafnium oxide and a film formed using an oxide semiconductor is used for the insulating layer included in the capacitor 164 so that $\in$r1 can be set to 10 or more, preferably 15 or more, and silicon oxide is used for the insulating layer forming gate capacitance so that $\in$r2 can be set to 3 to 4.

A combination of such structures enables higher integration of the semiconductor device according to the disclosed invention.

Note that in addition to the increase in integration degree, a value multiplexing technique can be employed in order to increase the storage capacity of the semiconductor device. For example, three or more levels of data are written to one memory cell, so that the storage capacity can be increased as compared to the case where two levels of data are written. The value multiplexing technique can be realized by, for example, giving electrical charge Q for applying a different potential to the gate electrode of the first transistor, in addition to the electrical charge $Q_L$ for applying a low potential and the electrical charge $Q_H$ for applying a high potential. In that case, enough storage capacity can be secured even when a circuit structure in which $F^2$ is not sufficiently small is employed.

Note that although an n-channel transistor in which electrons are majority carriers is used in the above description, it is needless to say that a p-channel transistor in which holes are majority carriers can be used instead of the n-channel transistor.

APPLICATION EXAMPLE 1

Figure 3:
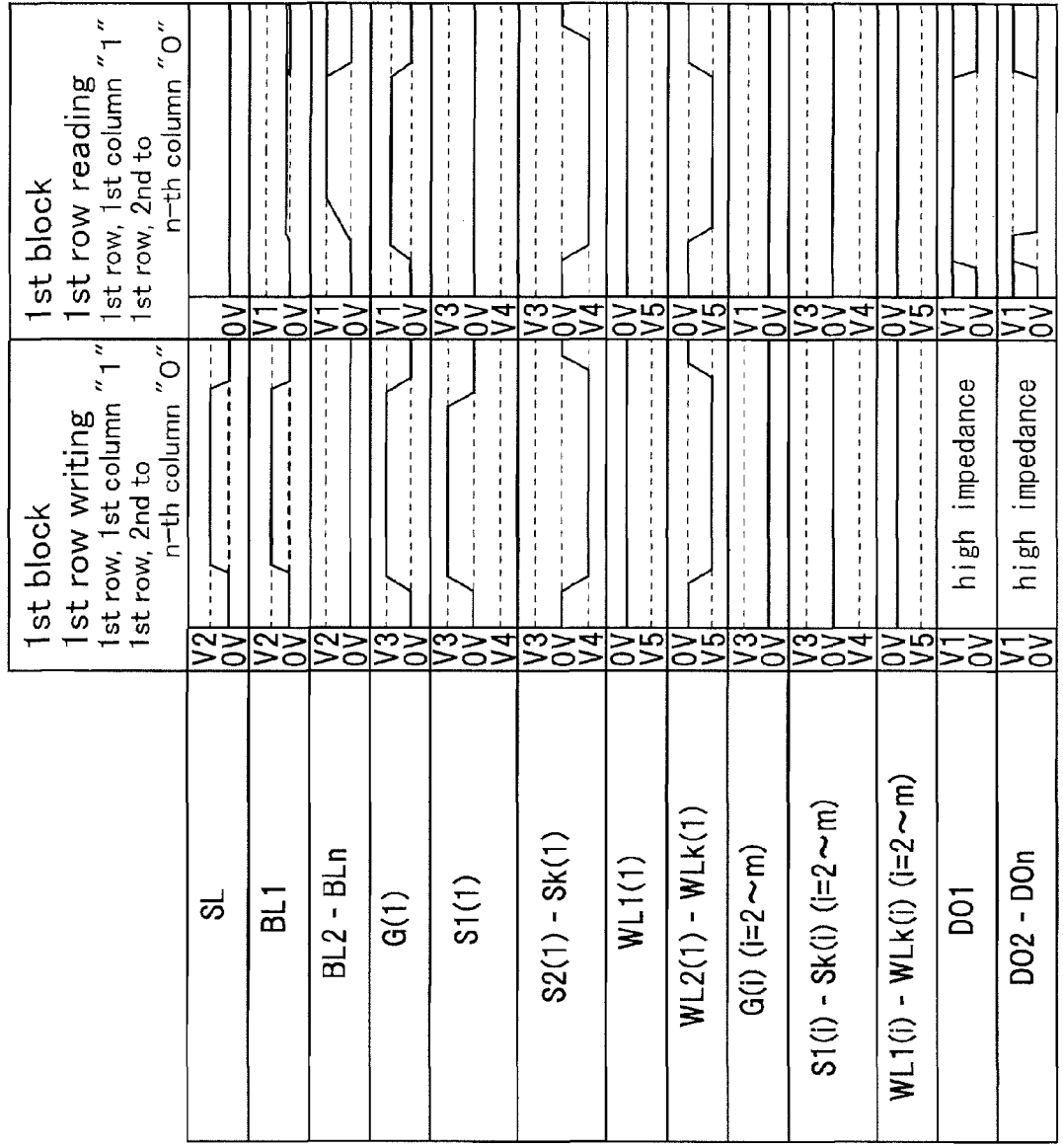
FIG. 3 is a timing chart.

Next, a more specific circuit structure to which the circuit illustrated in FIGS. 1A-1 and 1A-2 is applied and operation of the circuit are described with reference to FIG. 2, FIG. 3, and FIG. 4.

FIG. 2 is an example of a circuit diagram of a semiconductor device including a plurality of memory cells that are divided into blocks every plural rows. In the semiconductor device of one embodiment of the present invention, a memory cell 1100 includes memory cell arrays that are divided into m blocks (a first block to an m-th block, where m is an integer of 2 or more) every k rows (k is an integer of 2 or more) and are arranged in matrix of k×m columns in the vertical direction by n rows (n is an integer of 2 or more) in the horizontal direction; k×m signal lines S; k×m word lines WL; n common bit lines BL; a common source line SL used in common among the memory cells; m selection lines G; m×n selection transistors 180; and m×n divided bit lines LBL. Note that the common bit lines BL are electrically connected to the divided bit lines LBL through the selection transistors 180 in the blocks, and the selection lines G are electrically connected to gate electrodes of the selection transistors 180. In FIG. 2, in the case where the same kinds of plurality of wirings are included in each block, the wirings are denoted by reference numerals. In addition, the same kinds of wirings in different blocks are denoted by reference numerals in parentheses.

Here, the structure illustrated in FIG. 1A-1 is applied to the memory cell 1100. Each of the memory cells 1100 includes a first transistor, a second transistor, and a capacitor. In each of the memory cells 1100, a gate electrode of the first transistor, a drain electrode (or a source electrode) of the second transistor, and one electrode of the capacitor are electrically connected to each other, and the common source line SL and a source electrode of the first transistor are electrically connected to each other. In addition, the divided bit line LBL, a drain electrode of the first transistor, and the source electrode (or the drain electrode) of the second transistor are electrically connected to each other. The word line WL and the other electrode of the capacitor are electrically connected to each other. The signal line S and a gate electrode of the second transistor are electrically connected to each other. In other words, the common source line SL corresponds to the first wiring (1st Line) in the structure illustrated in FIG. 1A-1; the divided bit line LBL corresponds to the second wiring (2nd Line) and the third wiring (3rd Line); the signal line S corresponds to the fourth wiring (4th Line); and the word line WL corresponds to the fifth wiring (5th Line).

Figure 13:
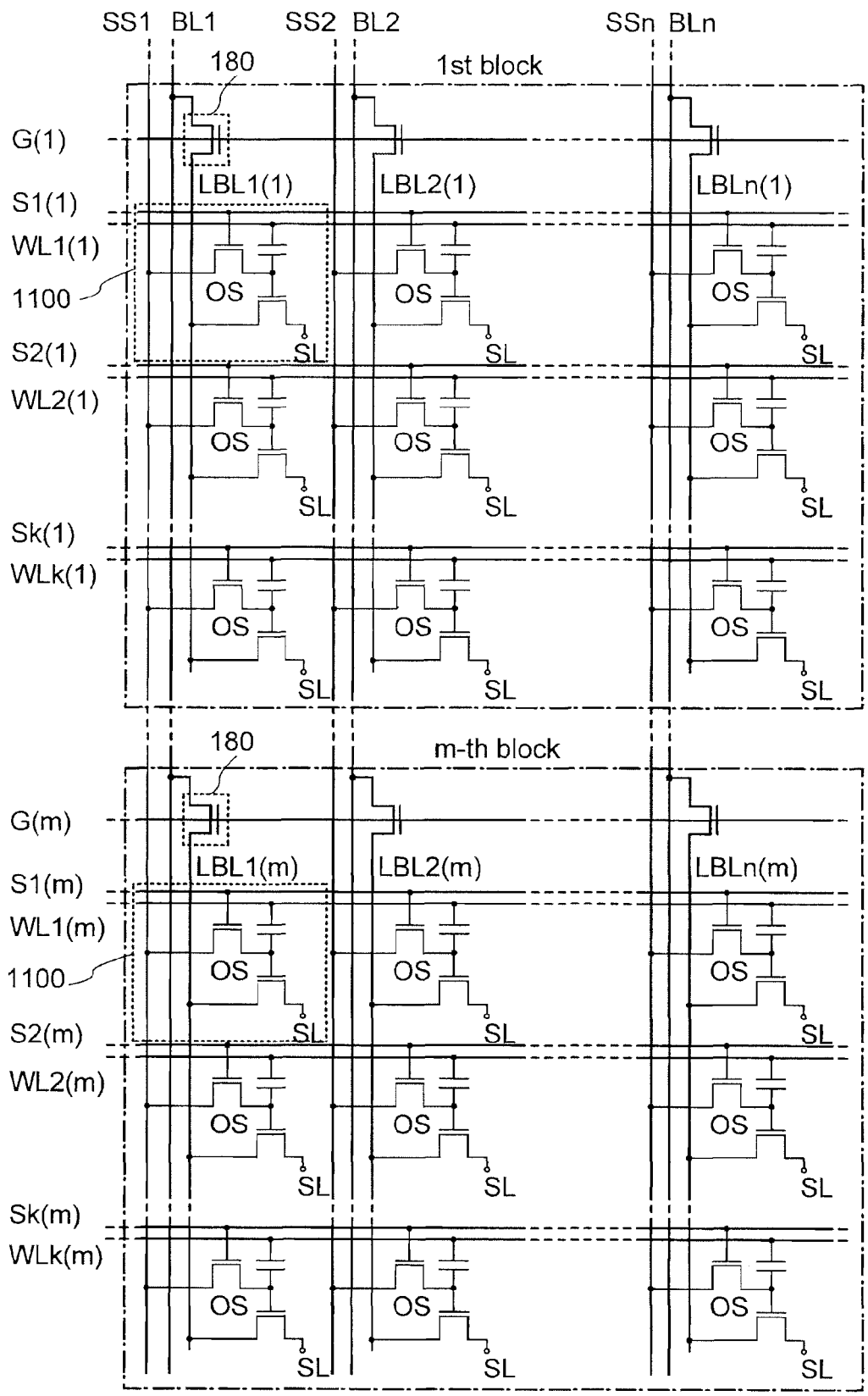
FIG. 13 is a circuit diagram of a semiconductor device.

Note that the source electrode (or the drain electrode) of the second transistor is not necessarily connected to the divided bit line LBL. For example, as illustrated in FIG. 13, n second signal lines SS may be formed so that the source electrode (or the drain electrode) of the second transistor is electrically connected to the second signal line SS in the column.

In each block of the memory cell array illustrated in FIG. 2, k memory cells 1100 arranged in one column are connected to one of the divided bit lines LBL. In addition, n memory cells 1100 arranged in one row are connected to one of the word lines WL and one of the signal lines S. One selection line G is provided in each block, and n selection transistors 180 arranged in one row are connected to the one selection line G. Here, the divided bit line LBL is connected to the common bit line BL through the selection transistor 180 in each block. In other words, m divided bit lines LBL arranged in one column are connected to one of the common bit lines BL through the selection transistors 180. Further, the common source line SL is used in common among all the memory cells; however, one common source line SL may be provided every column or every plural columns.

Here, the number of rows of the memory cells included in one block of the memory cell array may be determined as appropriate in accordance with the number of memory cells that are included in the memory cell array and the number of blocks. For example, the number of rows is preferably 8 to 64.

The common bit line BL, the common source line SL, the signal line S, the word line WL, and the selection line G are electrically connected to driver circuits provided around the memory cell array. The driver circuits may be provided independently according to the kind of wirings, or a plurality of kinds of wirings may be electrically connected to one driver circuit.

Next, writing operation and reading operation are described. FIG. 3 is an example of a timing chart of writing operation and reading operation of the semiconductor device illustrated in FIG. 2.

The case where data is written to the memory cell 1100 in a first block and a first row and the case where data is read from the memory cell 1100 in the first block and the first row are described. Note that in the following description, data to be written to the memory cell 1100 in the first block, the first row, and a first column (hereinafter also referred to as a memory cell (1,1,1)) is "1" and data to be written to the memory cell 1100 in the first block, the first row, and a second column (hereinafter also referred to as a memory cell (1,1,2)) to the memory cell 1100 in the first block, the first row, and an n-th column (hereinafter also referred to as a memory cell (1,1,n)) is "0".

First, the writing is described. A potential V3 is applied to the selection line G(1) so that the selection transistors 180 in the first block are turned on, and electrical continuity is established between the common bit lines BL1 to BLn and the divided bit lines LBL1(1) to LBLn(1). A potential 0 V is applied to the selection lines G(2) to G(m) so that the selection transistors 180 in the second to m-th blocks are turned off, and electrical continuity is not established between the common bit lines BL1 to BLn and the divided bit lines LBL other than the divided bit lines LBL1(1) to LBLn(1).

At this time, in the first block, the potential V3 is applied to the signal line S1(1) in the first row so that the second transistors in the first row are turned on. Further, a potential V4 (V4≤0 V) is applied to the signal lines S2(1) to Sk(1) in the second to k-th rows so that the second transistors in the second to k-th rows are turned off.

Then, in the first block, the potential 0 V is applied to the word line. WL1(1) in the first row, and a potential V5 (V5≤0 V) is applied to the word lines WL2(1) to WLk(1) in the second to k-th rows. When the word lines WL2(1) to WLk(1) in the second to k-th rows are at the potential V5, in the second to k-th rows, the first transistors of the memory cells in which either data "0" or data "1" is retained are turned off. Thus, in the second to k-th rows in the first block, current does not flow even if the potentials of the common source line SL and the common bit lines BL1 to BLn are different from each other.

Then, a potential V2 is applied to the common bit line BL1 in the first column, and the potential 0 V is applied to the common bit lines BL2 to BLn in the second to n-th columns Concurrently, the potential V2 is applied to the common source line SL.

As a result, the potential V2 is applied to a floating gate portion FG of the memory cell (1,1,1), and the potential 0 V is applied to floating gate portions FG of the memory cells (1,1,2) to (1,1,n). Then, the potential of the signal line S1(1) in the first row is set to 0 V so that the second transistors in the first row are turned off. Thus, the writing is completed.

Note that here, the potential V3 is higher than a potential obtained by addition of the threshold voltage of the second transistor to the potential V2. Thus, the potential V2 is applied to the floating gate portion FG of the memory cell (1,1,1) at the time of data writing. Further, the potential V2 is higher than the threshold voltage of the first transistor. Thus, the potential of the word line WL1(1) at the time of data reading can be 0 V, which is preferable. After the data writing, the potential of the signal line S1(1) in the first block and the first row is 0 V so that the second transistors in the first row are turned off before the potential of the common bit line BL1 is changed.

Note that the operation voltages at the time of data writing can be, for example, V2=2 V, V3=4 V, V4=−2 V, and V5=−4 V.

Here, in the first block that is the selected block, it is necessary to apply a negative potential (the potential V5) to the word lines WL2(1) to WLk(1) in non-selected rows; however, in the second to m-th blocks that are the non-selected blocks, electrical continuity is not established between the common bit lines BL and the divided bit lines LBL. Thus, electrical continuity is not established between the bit lines BL and the source lines SL through the divided bit lines LBL in the second to m-th blocks. Accordingly, in the second to m-th blocks that are the non-selected blocks, it does not matter whether the first transistors are on or off as long as data of the memory cells can be retained. Consequently, in the second to m-th blocks that are the non-selected blocks, the potentials of the word lines WL and the signal lines S can be kept at the potentials in the data retention state (e.g., 0 V). In this manner, in the writing operation, it is not necessary to change the potentials of the word lines WL and the signal lines S in the non-selected blocks; thus, power consumed for storing and releasing electricity in and from the word lines WL and the signal lines S in the non-selected blocks can be reduced.

In other words, with a structure in which the common bit lines BL in each block are divided into the divided bit lines LBL through the selection transistors 180, the power consumption of the semiconductor device at the time of data writing can be reduced.

Here, potentials applied to the signal lines S2(1) to Sk(1) in the second to k-th rows and the word lines WL2(1) to WLk(1) in the second to k-th rows in the first block in the writing operation are described. The potential V5 (V5≤0 V) is applied to the word lines WL2(1) to WLk(1) in the second to k-th rows in order that steady-state current does not flow between the common bit lines BL and the source lines SL. When the potential V5 is applied to the word lines WL2(1) to WLk(1) in the second to k-th rows, in the second to k-th rows, the first transistors of the memory cells in which either data "0" or data "1" is retained are turned off. Thus, in the second to k-th rows in the first block, current does not flow even if the potentials of the common source lines SL and the common bit lines BL1 to BLn are different from each other.

The potential V4 (V4≤0 V) is applied to the signal lines S2(1) to Sk(1) in the second to k-th rows in the first block in order that data of the memory cells in the second to k-th rows be retained. When the potential V5 (V5≤0 V) is applied to the word lines WL2(1) to WLk(1) in the second to k-th rows, the floating gate portions FG in the memory cells in the second to k-th rows might have negative potentials. Even in that case, when the potential V4 (V4≤0 V) is applied to the signal lines S2(1) to Sk(1) in the second to k-th rows, the second transistors in the second to k-th rows can be turned off.

In addition, a potential applied to the common source lines SL at the time of data writing is described. In the case where the potential V2 (corresponding to data "1") is applied to the common bit line BL, steady-state current does not flow because the potentials of the common bit line BL and the common source line SL are at the same levels. In the case where 0 V (corresponding to data "0") is applied to the common bit line BL, the first transistor is turned off because 0 V is applied to the floating gate portion FG of the memory cell to which data is written. Thus, current does not flow between the common bit line BL and the source line SL. Note that in the case where all the written data are data "0", the potential 0 V may be applied to the common source line SL. As described above, current flowing to the common bit line BL is reduced in the writing operation, so that power consumption can be reduced.

Then, the reading is described. Here, a reading circuit illustrated in FIG. 4 is electrically connected to the common bit lines BL1 to BLn.

First, the potential V1 is applied to the selection line G(1) so that the selection transistors 180 in the first block are turned on, and electrical continuity is established between the common bit lines BL1 to BLn and the divided bit lines LBL1(1) to LBLn(1). The potential 0 V is applied to the selection lines G(2) to G(m) so that the selection transistors 180 in the second to m-th blocks are turned off, and electrical continuity is not established between the common bit lines BL1 to BLn and the divided bit lines LBL other than the divided bit lines LBL1(1) to LBLn(1).

At this time, in the first block, the potential 0 V is applied to the word line WL1(1) in the first row, and the potential V5 (V5≤0 V) is applied to the word lines WL2(1) to WLk(1) in the second to k-th rows. When the word line WL1(1) is at the potential of 0 V, in the first row, the first transistors of the memory cells in which data "0" is retained are turned off, and the first transistors of the memory cells in which data "1" is retained are turned on. When the word lines WL2(1) to WLk (1) are at the potential V5, in the second to k-th rows, the first transistors of the memory cells in which either data "0" or data "1" is retained are turned off.

In the first block, the potential 0 V is applied to the signal line S1(1) in the first row and the potential V4 (V4≤0 V) is applied to the signal lines S2(1) to Sk(1) in the second to k-th rows so that all the second transistors in the first block are turned off.

Here, the potential of the floating gate portion FG in the first block and the first row is 0 V or V2; thus, when the potential of the signal line S1(1) is set to 0 V, all the second transistors in the first block and the first row can be turned off. In contrast, the floating gate portions FG in the first block and the second to k-th rows might have negative potentials when the potential V5 (V5≤0 V) is applied to the word lines WL2(1) to WLk(1). Even in that case, when the potential V4 (V4≤0 V) is applied to the signal lines S2(1) to Sk(1) in the second to k-th rows, the second transistors in the first block and the second to k-th rows can be turned off. Thus, all the second transistors in the first block can be turned off.

As a result, the resistance between the common bit line BL1 and the common source line SL is low because the first transistor in the memory cell (1,1,1) is on, and the resistance between the common bit lines BL2 to BLn and the common source line SL is high because the first transistors in the memory cells (1,1,2) to (1,1,n) are off. A reading circuit which is electrically connected to the common bit lines BL1 to BLn can read data from the level of resistance between the common bit line and the common source line.

Figure 4:
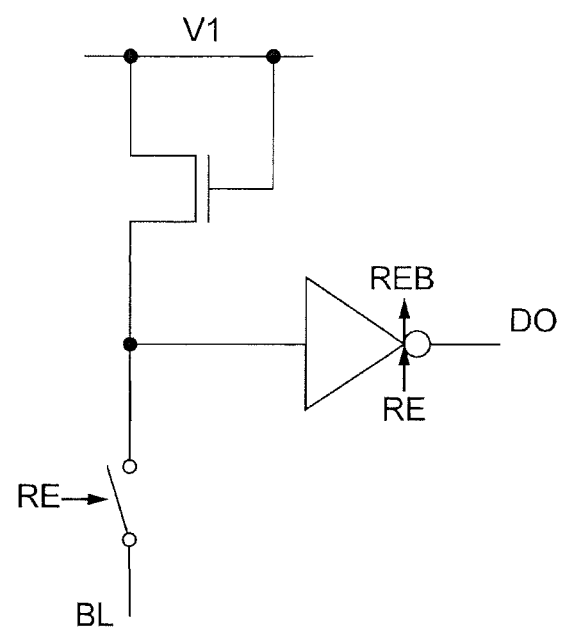
FIG. 4 is a circuit diagram of a semiconductor device.

Next, output potentials at the time when the circuit illustrated in FIG. 4 is used as a reading circuit are described. In the reading circuit illustrated in FIG. 4, the common bit line BL is connected to a clocked inverter and a transistor which is diode-connected to a wiring to which the potential V1 is applied, through a switch controlled by a read enable signal (an RE signal). Further, a low potential (e.g., 0 V) is applied to the common source line SL. Since the resistance between the common bit line BL1 and the common source line SL is low, the low potential is applied to the clocked inverter and an output DO1 is high. Since the resistance between the common bit lines BL2 to BLn and the source lines SL is high, a high potential is applied to the clocked inverter and outputs DO2 to DOn are low.

Note that the operation voltages at the time of data reading can be, for example, V1=2 V, V4=−2 V, and V5=−4 V.

Here, as in the data writing, at the time of data reading, in the first block that is the selected block, it is necessary to apply a negative potential (the potential V5) to the word lines WL2(1) to WLk(1) in non-selected rows; however, in the second to m-th blocks that are the non-selected blocks, electrical continuity is not established between the common bit lines BL and the divided bit lines LBL. Thus, electrical continuity is not established between the common bit lines BL and the source lines SL through the divided bit lines LBL in the second to m-th blocks.

Accordingly, in the second to m-th blocks that are the non-selection blocks, it does not matter whether the first transistors are on or off as long as data of the memory cells can be retained. Consequently, in the second to m-th blocks that are the non-selected blocks, the potentials of the word lines WL and the signal lines S can be kept at the potentials in the data retention state (e.g., 0 V). In this manner, in the reading operation, it is not necessary to change the potentials of the word lines WL and the signal lines S in the non-selected blocks; thus, power consumed for storing and releasing electricity in and from the word lines WL and the signal lines S in the non-selected blocks can be reduced.

With the structure in which the common bit lines BL in each block are divided into the divided bit lines LBL through the selection transistors 180, leakage current flowing to the common bit lines can be reduced. In the case where the bit lines are not divided, k×m memory cells are directly connected to the bit lines; however, with a structure in which common bit lines are divided as disclosed in the present invention, in selection transistors are connected to the common bit lines. Accordingly, the stability of the reading operation can be improved or the reading operation can be performed at higher speed.

In other words, with the structure in which the common bit lines BL in each block are divided into the divided bit lines LBL through the selection transistors 180, the power consumption of the semiconductor device at the time of data reading can be reduced. Further, the data read performance of the semiconductor device can be improved.

A semiconductor device including an oxide semiconductor whose off-state current is extremely low is used as the semiconductor device illustrated in FIG. 2, so that stored data can be retained for an extremely long time. In other words, refresh operation is not needed or the frequency of the refresh operation can be extremely decreased, which leads to a sufficient reduction in power consumption. Further, stored data can be retained for a long time even when power is not supplied.

Further, the semiconductor device illustrated in FIG. 2 does not need high voltage for writing data and does not have the problem of deterioration of elements. Thus, the semiconductor device illustrated in FIG. 2 does not have the limitation on the number of writing, which is a problem of a conventional non-volatile memory, and reliability thereof is markedly improved. Furthermore, data is written depending on the on and off of the transistor, so that high-speed operation can be easily realized. Additionally, there is an advantage that operation for erasing data is not needed.

Since a transistor including a material other than an oxide semiconductor can operate at sufficiently high speed, a semiconductor device can perform operation (e.g., data reading) at sufficiently high speed in combination of the transistor including a material other than an oxide semiconductor and a transistor including an oxide semiconductor. Further, a transistor including a material other than an oxide semiconductor can favorably realize a variety of circuits (e.g., a logic circuit or a driver circuit) which need to operate at high speed.

A semiconductor device having a novel feature can be realized by provision of both the transistor including a material other than an oxide semiconductor and the transistor including an oxide semiconductor.

Further, in the semiconductor device illustrated in FIG. 2, with the structure in which the common bit lines BL in each block are divided into the divided bit lines LBL through the selection transistors 180, the potentials of the word lines WL and the signal lines S in the non-selected blocks at the time of data writing and data reading can be kept at the potentials in the data retention state (e.g., 0 V). Accordingly, it is not necessary to change the potentials of the word lines WL and the signal lines S in the non-selected blocks at the time of data writing and data reading, so that the power consumption of the semiconductor device can be reduced. Further, the data read performance of the semiconductor device can be improved.

As described above, the structures, methods, and the like described in this embodiment can be combined with any of the structures, methods, and the like described in the other embodiments as appropriate.

(Embodiment 2)

In this embodiment, a structure and a method for manufacturing a semiconductor device of one embodiment of the disclosed invention are described with reference to FIGS. 5A and 5B, FIGS. 6A and 6B, FIGS. 7A to 7E, FIGS. 8A to 8C, FIGS. 9A to 9D, and FIGS. 10A to 10C.

<Cross-Sectional Structure and Planar Structure of Semiconductor Device>

Figure 5A:
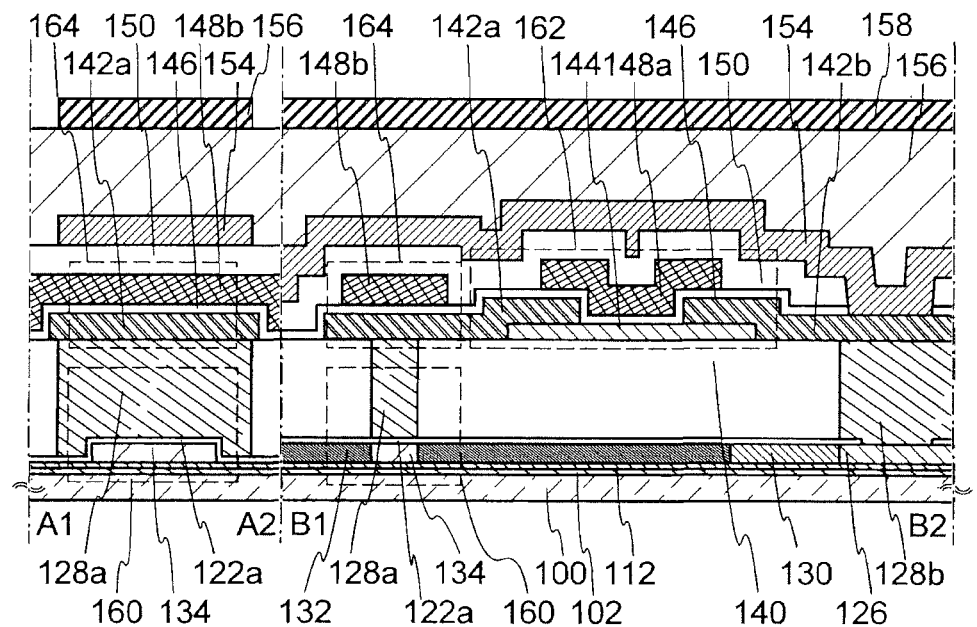
FIGS. 5A and 5B are a cross-sectional view and a plan view of a semiconductor device.
Figure 5B:
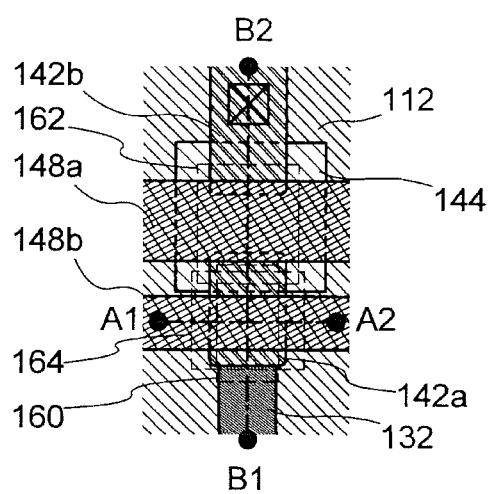

FIGS. 5A and 5B illustrate an example of the structure of a semiconductor device corresponding to the circuit illustrated in FIG. 1A-1 or the memory cell 1100 illustrated in FIG. 2. FIG. 5A is a cross-sectional view of the semiconductor device, and FIG. 5B is a plan view of the semiconductor device. Here, FIG. 5A corresponds to a cross section taken along line A1-A2 and line B1-B2 in FIG. 5B. Note that in FIG. 5B, some of components of the semiconductor device (e.g., wirings 154 and 158) are omitted in order to avoid complexity.

The semiconductor device illustrated in FIGS. 5A and 5B includes the transistor 160 including a first semiconductor material in a lower portion and the transistor 162 including a second semiconductor material in an upper portion. Here, the first semiconductor material and the second semiconductor material are preferably different from each other. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, indium phosphide, gallium arsenide, or the like and is preferably single crystalline. Alternatively, an organic semiconductor material or the like may be used. A transistor including such a semiconductor material can operate at high speed easily. On the other hand, a transistor including an oxide semiconductor can store electrical charge for a long time because of its characteristics.

Either an n-channel transistor or a p-channel transistor can be used as the transistor 160 and the transistor 162. Here, the case in which the transistors 160 and 162 are n-channel transistors is described. The technical feature of the disclosed invention lies in the use of a semiconductor material with which off-state current can be sufficiently reduced, such as an oxide semiconductor, for the transistor 162 in order to retain data. It is therefore not necessary to limit specific conditions, such as materials, structures, and the like of the semiconductor device, to those given here.

The transistor 160 in FIGS. 5A and 5B includes a channel formation region 134 provided in a semiconductor layer over a base substrate 100, impurity regions 132 (also referred to as a source region and a drain region) with the channel formation region 134 provided therebetween, a gate insulating layer 122*a* provided over the channel formation region 134, and a gate electrode 128*a* provided over the gate insulating layer 122*a* so as to overlap with the channel formation region 134. Note that a transistor whose source electrode and drain electrode are not explicitly illustrated in a drawing might be referred to as a transistor for convenience. Further, in such a case, in description of the connection of a transistor, a source region and a source electrode might be collectively referred to as a "source electrode," and a drain region and a drain electrode might be collectively referred to as a "drain electrode". That is, in this specification, the term "source electrode" might include a source region.

Further, a conductive layer 128*b* is connected to an impurity region 126 provided in the semiconductor layer over the base substrate 100. Here, the conductive layer 128*b* functions as a source electrode or a drain electrode of the transistor 160. In addition, an impurity region 130 is provided between the impurity region 132 and the impurity region 126. An insulating layer 140 is provided so as to cover the transistor 160. Note that in order to realize high integration, it is preferable that the transistor 160 does not have a sidewall insulating layer as illustrated in FIGS. 5A and 5B. On the other hand, in the case where the characteristics of the transistor 160 have priority, a sidewall insulating layer may be provided on a side surface of the gate electrode 128*a*, and the impurity region 132 may include a region with a different impurity concentration.

The transistor 162 in FIGS. 5A and 5B includes an oxide semiconductor layer 144 provided over the insulating layer 140 and the like, source and drain electrodes 142*a* and 142*b* electrically connected to the oxide semiconductor layer 144, a gate insulating layer 146 for covering the oxide semiconductor layer 144 and the source and drain electrodes 142*a* and 142*b*, and a gate electrode 148*a* provided over the gate insulating layer 146 so as to overlap with the oxide semiconductor layer 144.

Here, the oxide semiconductor layer 144 is preferably a highly-purified oxide semiconductor layer by sufficient removal of impurities such as hydrogen or sufficient supply of oxygen. Specifically, the hydrogen concentration in the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower, for example. Note that the hydrogen concentration in the oxide semiconductor layer 144 is measured by secondary ion mass spectroscopy (SIMS). The oxide semiconductor layer 144 which is highly purified by a sufficient reduction in the hydrogen concentration and is reduced in defect level in an energy gap due to oxygen deficiency by sufficient supply of oxygen has a carrier concentration of lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per unit channel width (1 μm)) at room temperature (25° C.) is 100 zA (1 zA (zeptoampere) is $1 \times 10^{-21}$ A) or lower, preferably 10 zA or lower. In this manner, with the use of an oxide semiconductor which is made to be an intrinsic (i-type) or substantially intrinsic oxide semiconductor, the transistor 162 which has extremely excellent off-state current characteristics can be obtained.

Although the oxide semiconductor layer 144 which is processed into an island shape is used in the transistor 162 of FIGS. 5A and 5B in order to reduce leakage current generated between elements due to miniaturization, the oxide semiconductor layer 144 is not necessarily processed into an island shape. In the case where the oxide semiconductor layer 144 is not processed into an island shape, contamination of the oxide semiconductor layer 144 due to etching in the processing can be prevented.

Although the transistor 162 illustrated in FIGS. 5A and 5B has a structure in which the gate electrode 148*a* overlaps with the source and drain electrodes 142*a* and 142*b*, one embodiment of the disclosed invention is not limited to this structure. For example, a region (hereinafter referred to as an offset region) which overlaps with neither the gate electrode 148*a* nor the source and drain electrodes 142*a* and 142*b* may be provided in the oxide semiconductor layer 144. The offset region serves as a resistance region when the transistor is driven. Thus, provision of an offset region in the oxide semiconductor layer 144 can reduce the off-state current of the transistor 162.

The capacitor 164 in FIGS. 5A and 5B includes the source or drain electrode 142*a*, the gate insulating layer 146, and a conductive layer 148*b*. In other words, the source or drain electrode 142*a* functions as one electrode of the capacitor 164, and the conductive layer 148*b* functions as the other electrode of the capacitor 164. With such a structure, capacitance can be sufficiently secured. Further, insulation between the source or drain electrode 142*a* and the conductive layer 148*b* can be sufficiently secured in the case where the oxide semiconductor layer 144 and the gate insulating layer 146 are stacked.

Note that in the transistor 162 and the capacitor 164, end portions of the source and drain electrodes 142*a* and 142*b* are preferably tapered. The end portions of the source and drain electrodes 142*a* and 142*b* are tapered, so that coverage with the gate insulating layer 146 can be improved and disconnection can be prevented. In that case, it is preferable that a taper angle be 30 to 60°, for example. Note that the taper angle is a tilt angle formed by a side surface and a bottom surface of a layer having a tapered shape (e.g., the source or drain electrode 142*a*) when the layer is seen from a direction perpendicular to a cross section (a plane perpendicular to a surface of the base substrate 100).

In this embodiment, the transistor 162 and the capacitor 164 are provided so as to overlap with the transistor 160 at least partly. With such a planar layout, the semiconductor device can be highly integrated.

An insulating layer 150 is provided over the transistor 162 and the capacitor 164. The wiring 154 is provided in an opening formed in the gate insulating layer 146 and the insulating layer 150. The wiring 154 connects one memory cell to another memory cell and functions as the divided bit line LBL in the semiconductor device illustrated in FIG. 2. The wiring 154 is connected to the impurity region 126 through the source or drain electrode 142*b* and the conductive layer 128*b*. Thus, the number of wirings can be reduced as compared to the case where the source region or the drain region in the transistor 160 and the source electrode or the drain electrode 142*b* in the transistor 162 are connected to different wirings. Accordingly, the integration degree of the semiconductor device can be improved.

With provision of the conductive layer 128*b*, a position where the impurity region 126 and the source or drain electrode 142*b* are connected to each other and a position where the source or drain electrode 142*b* and the wiring 154 are connected to each other can overlap with each other. With such a planar layout, the increase in element area due to contact regions can be prevented. That is, the integration degree of the semiconductor device can be improved.

An insulating layer 156 is provided over the wiring 154. The wiring 158 is provided over the insulating layer 156 so as to overlap with the wiring 154. The wiring 158 connects one memory cell to another memory cell and functions as the common bit line BL in the semiconductor device illustrated in FIG. 2. When the wiring 158 is provided so as to overlap with the wiring 154, the increase in area of the wiring 158 can be suppressed. Thus, the semiconductor device illustrated in FIG. 2 can be manufactured without the decrease in integration degree of the semiconductor device. With such a planar layout, the area of the memory cell can be, for example, 8 to 20 $F^2$ assuming that the minimum feature size is F.

Figure 6A:
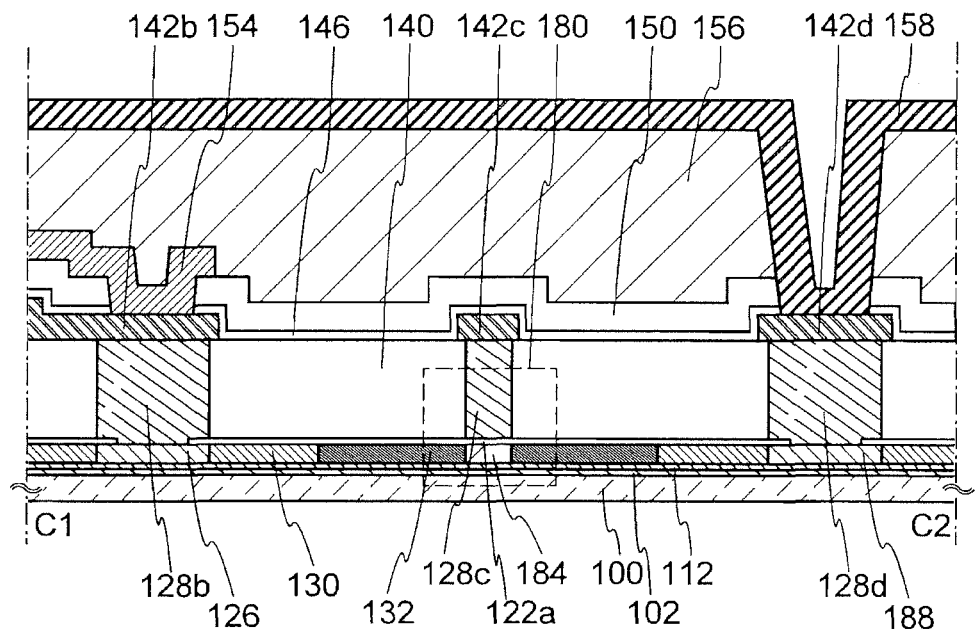
FIGS. 6A and 6B are a cross-sectional view and a plan view of a semiconductor device.
Figure 6B:
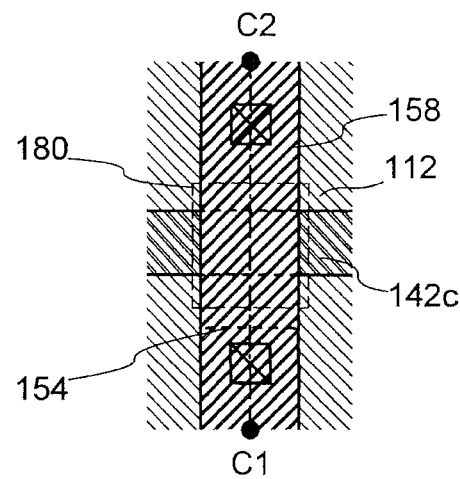

Next, a structure example of a semiconductor device that corresponds to the selection transistor 180 illustrated in FIG. 2 and is formed over the same substrate as the semiconductor device illustrated in FIGS. 5A and 5B is described with reference to FIGS. 6A and 6B. Here, components near line C1 in FIGS. 6A and 6B are the same as the components near line B2 in FIGS. 5A and 5B. In FIGS. 6A and 6B, portions that are similar to the portions in FIGS. 5A and 5B are denoted by the same reference numerals, and description of such portions is not repeated.

FIG. 6A is a cross-sectional view of the semiconductor device, and FIG. 6B is a plan view of the semiconductor device. Here, FIG. 6A corresponds to a cross section taken along line C1-C2 in FIG. 6B. Note that in FIG. 6B, some of components of the semiconductor device (e.g., the impurity regions 130 and 132) are omitted in order to avoid complexity.

The semiconductor device illustrated in FIGS. 6A and 6B includes the selection transistor 180 including the first semiconductor material in a lower portion. By using the first semiconductor material for the selection transistor 180 in this manner, the selection transistor 180 can operate at high speed easily. Thus, data writing and data reading in the semiconductor device described in the above embodiment can be performed at higher speed.

Either an n-channel transistor or a p-channel transistor can be used as the selection transistor 180. Here, the case in which the selection transistor 180 is an n-channel transistor is described. As in the transistor 160 and the transistor 162, it is not necessary to limit specific conditions, such as materials, structures, and the like of the semiconductor device, to those given here.

The selection transistor 180 in FIGS. 6A and 6B has a structure that is similar to the structure of the transistor 160 in FIGS. 5A and 5B and includes a channel formation region 184 provided in the semiconductor layer over the base substrate 100, the impurity regions 132 (also referred to as the source region and the drain region) with the channel formation region 184 provided therebetween, the gate insulating layer 122*a* provided over the channel formation region 184, and a gate electrode 128*c* provided over the gate insulating layer 122*a* so as to overlap with the channel formation region 184. In addition, in the selection transistor 180 illustrated in FIGS. 6A and 6B, a conductive layer 142*c* is provided over the gate electrode 128*c* so as to cover the gate electrode 128*c*. Note that the conductive layer 142*c* is not necessarily provided.

Further, a conductive layer 128*d* is connected to an impurity region 188 provided in the semiconductor layer over the base substrate 100. Here, the conductive layer 128*d* functions as a source electrode or a drain electrode of the selection transistor 180. In addition, the impurity region 130 is provided between the impurity region 132 and the impurity region 188. The impurity region 130 is also provided between the impurity region 132 and the impurity region 126. Thus, the impurity region 126 and the impurity region 188 are electrically connected to each other through the selection transistor 180.

A conductive layer 142*d* is provided over the conductive layer 128*d* so as to cover the conductive layer 128*d*. The wiring 158 over the insulating layer 156 is connected to the conductive layer 142*d* through an opening formed in the gate insulating layer 146, the insulating layer 150, and the insulating layer 156. The wiring 158 is connected to the impurity region 188 with the conductive layer 142*d* and the conductive layer 128*d* provided therebetween. Thus, a source region or a drain region in the selection transistor 180 is electrically connected to the wiring 158. The wiring 158 is electrically connected to the wiring 154 through the selection transistor 180. Note that the conductive layer 142*d* is not necessarily provided.

<Method for Manufacturing Semiconductor Device>

Next, an example of a method for manufacturing the semiconductor device is described. First, a method for forming the transistor 160 in the lower portion is described below with reference to FIGS. 7A to 7D and FIGS. 8A to 8C. Then, a method for forming the transistor 162 in the upper portion and the capacitor 164 is described with reference to FIGS. 9A to 9D and FIGS. 10A to 10C.

<Method for Forming Transistor in Lower Portion>

The method for forming the transistor 160 in the lower portion is described with reference to FIGS. 7A to 7D and FIGS. 8A to 8C.

First, a substrate including a semiconductor material is prepared. As the substrate including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. It is preferable that a single crystal semiconductor substrate of silicon or the like be used as the substrate including a semiconductor material because the speed of reading operation of the semiconductor device can be increased.

Here, the case is described in which an SOI substrate where a semiconductor layer is provided over the base substrate 100 with an insulating layer 102 and an insulating layer 112 provided therebetween as the substrate including a semiconductor material. Note that although the term "SOI substrate" generally means a substrate where a silicon semiconductor layer is provided on an insulating surface, the term "SOI substrate" in this specification and the like also includes a substrate where a semiconductor layer including a material other than silicon is provided on an insulating surface. That is, a semiconductor layer included in the "SOI substrate" is not limited to a silicon semiconductor layer. Further, the SOI substrate can be a substrate having a structure in which a semiconductor layer is provided over an insulating substrate such as a glass substrate with an insulating layer provided therebetween.

As the base substrate 100, a substrate including an insulator can be used. Specific examples of the base substrate 100 are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Alternatively, a ceramic substrate which contains silicon nitride and aluminum nitride as its main components and whose coefficient of thermal expansion is close to that of silicon may be used.

Alternatively, a semiconductor substrate such as a single crystal silicon substrate or a single crystal germanium substrate may be used as the base substrate 100. Here, as a semiconductor substrate, a solar grade silicon (SOG-Si) substrate or the like may be used. Alternatively, a polycrystalline semiconductor substrate may be used. In the case where an SOG-Si substrate, a polycrystalline semiconductor substrate, or the like is used, manufacturing cost can be reduced as compared to the case where a single crystal silicon substrate or the like is used.

In this embodiment, the case where a glass substrate is used as the base substrate 100 is described. When a glass substrate which can have a larger size and is inexpensive is used as the base substrate 100, cost can be reduced.

The insulating layer 102 can be formed to have a single-layer structure or a layered structure including, for example, an insulating film containing nitrogen, such as a silicon nitride ($SiN_x$) film or a silicon nitride oxide ($SiN_xO_y$, where x>y) film. The insulating layer 102 can be formed by CVD, sputtering, or the like.

The insulating layer 112 can be formed to have a single-layer structure or a layered structure including, for example, a silicon oxide ($SiO_x$) film or a silicon oxynitride ($SiO_xN_y$) film. The insulating layer 112 can be formed by CVD, sputtering, heat treatment (e.g., thermal oxidation treatment or thermal nitriding treatment), or the like.

Figure 7A:
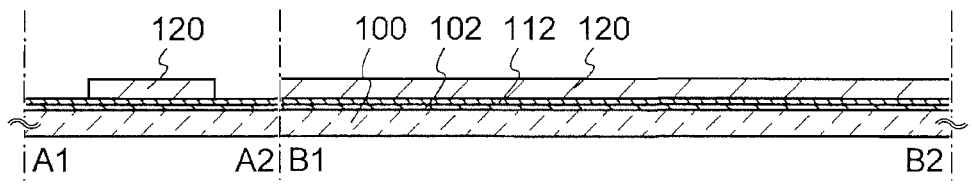
FIGS. 7A to 7E are cross-sectional views illustrating steps of manufacturing a semiconductor device.

The semiconductor layer is patterned into an island shape so that a semiconductor layer 120 is formed (see FIG. 7A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. Boron, aluminum, gallium, or the like can be used as an impurity element imparting p-type conductivity.

Figure 7B:
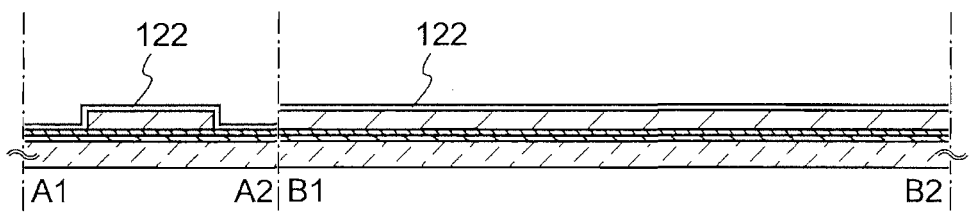

Next, an insulating layer 122 is formed so as to cover the semiconductor layer 120 (see FIG. 7B). The insulating layer 122 is to be a gate insulating layer later. The insulating layer 122 can be formed, for example, by performing heat treatment (e.g., thermal oxidation treatment or thermal nitriding treatment) on a surface of the semiconductor layer 120. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by CVD, sputtering, or the like. The insulating layer 122 preferably has a single-layer structure or a layered structure using a film including any of silicon oxide, silicon oxynitride, silicon nitride oxide, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like formed by CVD, sputtering, or the like. The thickness of the insulating layer 122 can be, for example, 1 to 100 nm, preferably 10 to 50 nm. Here, a single-layer insulating layer containing silicon oxide is formed by plasma-enhanced CVD.

Figure 7C:
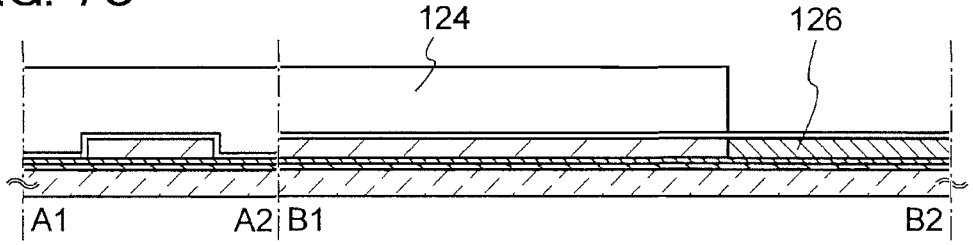

Next, a mask 124 is formed over the insulating layer 122 and an impurity element imparting one conductivity is added to the semiconductor layer 120, so that the impurity region 126 is formed (see FIG. 7C). Although only the case where an impurity element imparting p-type conductivity is added is described here because a p-channel transistor is formed, in the case where an n-channel transistor is formed, an impurity element imparting n-type conductivity is added. Note that the mask 124 is removed after the impurity element is added. The impurity region 188 can be formed by a method that is similar to the method for forming the impurity region 126; thus, the impurity region 188 illustrated in FIG. 6A can be formed concurrently.

Figure 7D:
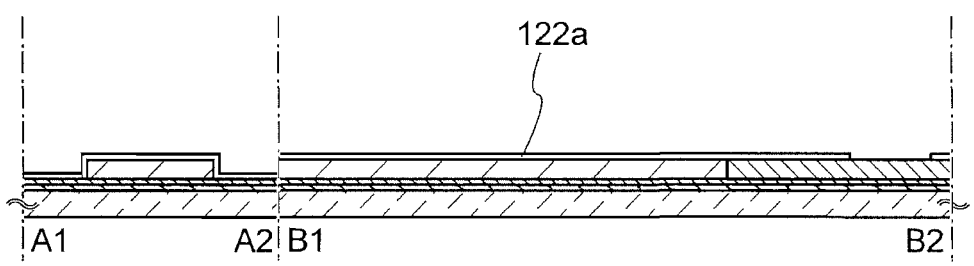

Next, a mask is formed over the insulating layer 122 and a region of the insulating layer 122 that overlaps with the impurity region 126 is partly removed, so that the gate insulating layer 122a is formed (see FIG. 7D). Part of the insulating layer 122 can be removed by etching such as wet etching or dry etching.

Figure 7E:
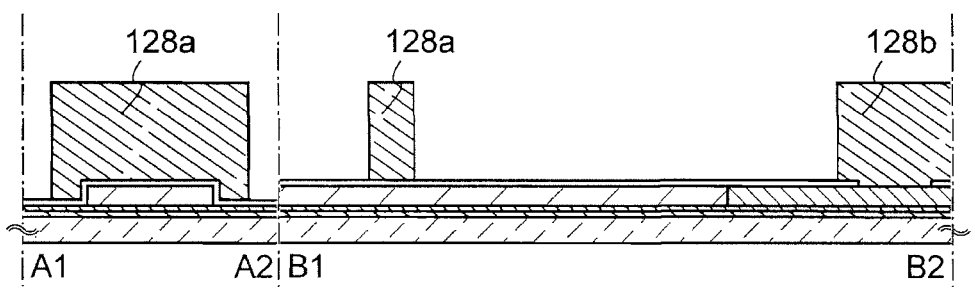

Next, a conductive layer used for forming a gate electrode (including a wiring formed using the same layer as the gate electrode) is formed over the gate insulating layer 122a and is processed, so that the gate electrode 128a and the conductive layer 128b are formed (see FIG. 7E).

The conductive layer used for the gate electrode 128a and the conductive layer 128b can be formed using a metal material such as aluminum, copper, titanium, tantalum, or tungsten. Alternatively, a layer including a conductive material may be formed using a semiconductor material such as polycrystalline silicon. There is no particular limitation on the method for forming the layer containing a conductive material, and a variety of deposition methods such as vapor deposition, CVD, sputtering, or spin coating can be employed. The conductive layer may be processed by etching using a resist mask. The gate electrode 128c and the conductive layer 128d can be formed by a method that is similar to the method for forming the gate electrode 128a and the conductive layer 128b; thus, the gate electrode 128c and the conductive layer 128d illustrated in FIG. 6A can be formed concurrently.

Figure 8A:
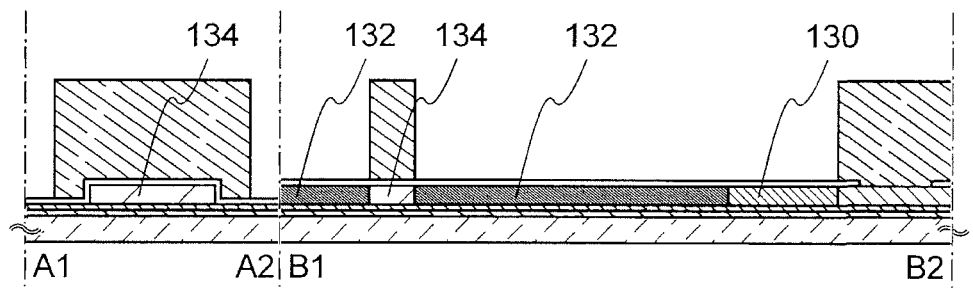
FIGS. 8A to 8C are cross-sectional views illustrating steps of manufacturing the semiconductor device.

Next, an impurity element imparting one conductivity is added to the semiconductor layer with the use of the gate electrode 128a and the conductive layer 128b as masks, so that the channel formation regions 134, the impurity regions 132, and the impurity region 130 are formed (see FIG. 8A). Although an impurity element such as boron (B) or aluminum (Al) is added here because a p-channel transistor is formed, in the case where an n-channel transistor is formed, an impurity element such as phosphorus (P) or arsenic (As) is added. Here, the concentration of an impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130. The channel formation region 184 can be formed by a method that is similar to the method for forming the channel formation region 134; thus, the channel formation region 184 illustrated in FIG. 6A can be formed concurrently.

Figure 8B:
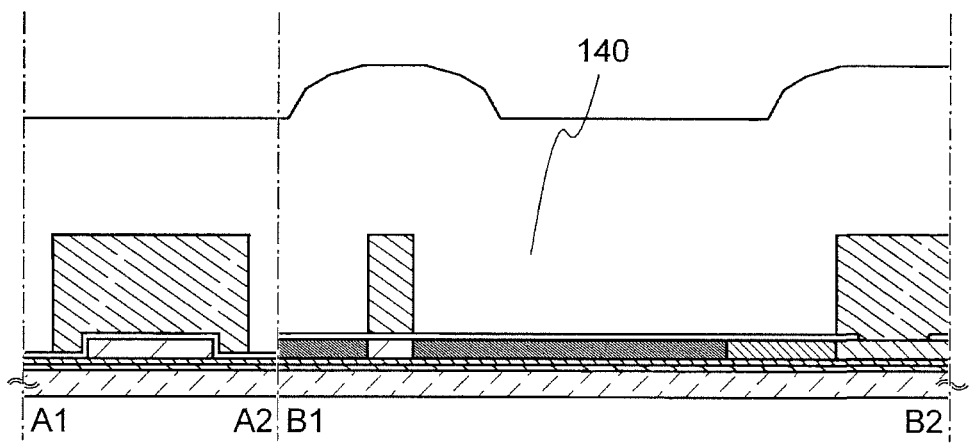

Next, the insulating layer 140 is formed so as to cover the gate insulating layer 122a, the gate electrode 128a, and the conductive layer 128b (see FIG. 8B).

The insulating layer 140 can be formed using an inorganic insulating material such as silicon oxide, silicon oxynitride, silicon nitride oxide, silicon nitride, or aluminum oxide. In particular, the insulating layer 140 is preferably formed using a low dielectric constant (low-k) material because capacitance due to overlapping of electrodes or wirings can be sufficiently reduced. Note that a porous insulating layer formed using such a material may be used as the insulating layer 140. Since the porous insulating layer has lower dielectric constant than a dense insulating layer, capacitance due to electrodes or wirings can be further reduced. Alternatively, the insulating layer 140 can be formed using an organic insulating material such as polyimide or acrylic. In this embodiment, the case where an insulating layer in which silicon oxynitride, silicon nitride oxide, and silicon oxide are stacked in that order is used as the insulating layer 140 is described. Note that although a layered structure of three layers is used in the insulating layer 140 in this embodiment, one embodiment of the disclosed invention is not limited to this structure. A single-layer structure, a layered structure of two layers, or a layered structure of four or more layers may be used.

Figure 8C:
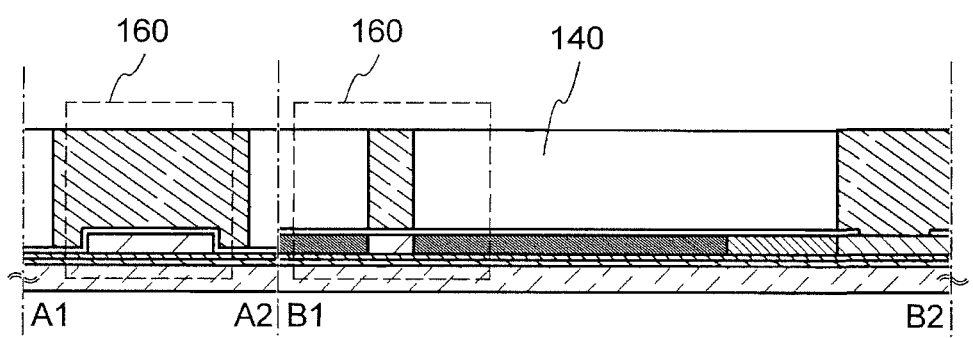

Next, the insulating layer 140 is subjected to CMP (chemical mechanical polishing) or etching, so that the insulating layer 140 is flattened and upper surfaces of the gate electrode 128a and the conductive layer 128b are exposed (see FIG. 8C). As described in this embodiment, in the case where an insulating layer in which silicon oxynitride, silicon nitride oxide, and silicon oxide are stacked in that order is used as the insulating layer 140, CMP is performed until silicon nitride oxide, which functions as an etching stopper, is exposed, and then, etching is performed until the gate electrode 128a and the conductive layer 128b are partly exposed. For the etching, dry etching is preferably performed, but wet etching may be performed. In a step of partly exposing the gate electrode 128a and the conductive layer 128b, in order to improve the characteristics of the transistor 162 which is formed later, the surface of the insulating layer 140 is preferably flattened as much as possible.

Through the steps, the transistor 160 in the lower portion can be formed (see FIG. 8C).

Note that before or after the steps, a step of forming an electrode, a wiring, a semiconductor layer, an insulating layer, or the like may be further performed. For example, a multilayer wiring structure in which an insulating layer and a conductive layer are stacked is employed as a wiring structure, so that a highly-integrated semiconductor device can be realized.

<Method for Forming Transistor in Upper Portion>

Next, a method for forming the transistor 162 in the upper portion is described with reference to FIGS. 9A to 9D and FIGS. 10A to 10C.

Figure 9A:
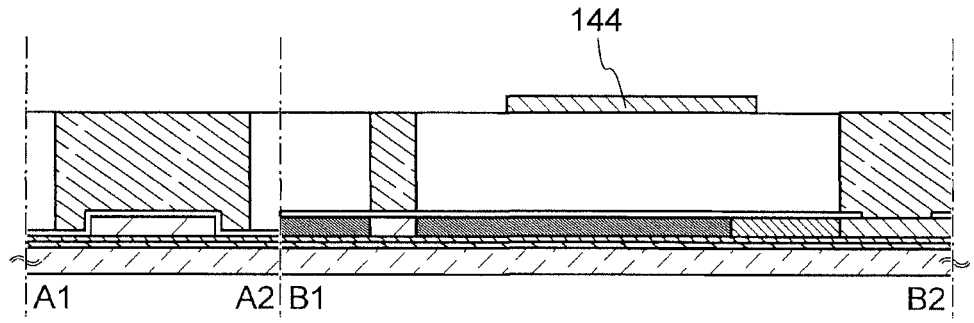
FIGS. 9A to 9D are cross-sectional views illustrating steps of manufacturing the semiconductor device.

First, an oxide semiconductor layer is formed over the gate electrode 128a, the conductive layer 128b, the insulating layer 140, and the like and is processed, so that the oxide semiconductor layer 144 is formed (see FIG. 9A). Note that an insulating layer functioning as a base may be formed over the insulating layer 140 before the oxide semiconductor layer is formed. The insulating layer can be formed by PVD such as sputtering, CVD such as plasma-enhanced CVD, or the like.

As a material used for the oxide semiconductor layer, a four-component metal oxide such as In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material; or the like can be used. In addition, the materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

The oxide semiconductor layer can be a thin film formed using a material expressed by a chemical formula of $InMO_3(ZnO)_m$ (m>0). Here, M represents one or more metal elements selected from Ga, Al, Mn, or Co. For example, M can be Ga, Ga and Al, Ga and Mn, Ga and Co, or the like.

The thickness of the oxide semiconductor layer is preferably 3 to 30 nm. This is because the transistor might be normally on when the oxide semiconductor layer is too thick (e.g., the thickness is 50 nm or more).

The oxide semiconductor layer is preferably formed by a method in which an impurity such as hydrogen, water, a hydroxyl group, or hydride does not enter the oxide semiconductor layer easily. For example, the oxide semiconductor layer can be formed by sputtering or the like.

In this embodiment, the oxide semiconductor layer is formed by sputtering using an In—Ga—Zn—O-based oxide semiconductor deposition target.

When an In—Ga—Zn—O-based material is used for the oxide semiconductor, for example, an oxide semiconductor deposition target with a composition ratio of $In_2O_3:Ga_2O_3:ZnO=1:1:1$ (in a molar ratio) can be used as a target. Without limitation on the material and the composition of the target, for example, an oxide semiconductor deposition target with a composition ratio of $In_2O_3:Ga_2O_3:ZnO=1:1:2$ (in a molar ratio) may be used.

An In—Zn—O-based material can be used for the oxide semiconductor. In the case where an In—Zn—O-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, when a target used for deposition of an In—Zn—O-based oxide semiconductor has a composition ratio of In:Zn:O=X:Y:Z in an atomic ratio, where Z>1.5X+Y.

An In—Sn—Zn—O-based material can be referred to as ITZO. In the case where an In—Sn—Zn—O-based material is used for the oxide semiconductor, an oxide target which has a composition ratio of In:Sn:Zn=1:2:2, 2:1:3, 1:1:1, or 20:45:35 in an atomic ratio is used.

The filling rate of the oxide semiconductor deposition target is 90 to 100%, preferably 95 to 99.9%. With the use of an oxide semiconductor deposition target with a high filling rate, a dense oxide semiconductor layer can be deposited.

The atmosphere for deposition may be a rare gas (typically argon) atmosphere, an oxygen atmosphere, or a mixed atmosphere containing a rare gas and oxygen. It is preferable to employ an atmosphere using a high-purity gas from which an impurity such as hydrogen, water, a hydroxyl group, or hydride is removed so that hydrogen, water, a hydroxyl group, hydride, or the like can be prevented from entering the oxide semiconductor layer.

For example, the oxide semiconductor layer can be formed as follows.

First, the substrate is held in a deposition chamber kept under reduced pressure, and is heated so that the substrate temperature is higher than 200° C. and lower than or equal to 500° C., preferably higher than 300° C. and lower than or equal to 500° C., more preferably higher than or equal to 350° C. and lower than or equal to 450° C.

Then, a high-purity gas from which an impurity such as hydrogen, water, a hydroxyl group, or hydride is sufficiently removed is introduced while moisture remaining in the deposition chamber is removed, and the oxide semiconductor layer is formed over the substrate with the use of the target. In order to remove moisture remaining in the deposition chamber, an adsorption vacuum pump such as a cryopump, an ion pump, or a titanium sublimation pump is preferably used. A turbo pump to which a cold trap is added may be used as an exhaustion means. In the deposition chamber which is exhausted with the cryopump, for example, an impurity such as hydrogen, water, a hydroxyl group, or hydride (preferably a compound containing a carbon atom) and the like are removed. Thus, the concentration of an impurity such as hydrogen, water, a hydroxyl group, or hydride contained in the oxide semiconductor layer deposited in the deposition chamber can be lowered.

In the case where the substrate temperature is low (for example, 100° C. or lower) during deposition, a substance including a hydrogen atom might enter the oxide semiconductor; thus, it is preferable that the substrate be heated at a temperature in the above range. When the oxide semiconductor layer is deposited with the substrate heated at the temperature, the substrate temperature is increased, so that hydrogen bonds are cut by heat and are less likely to be taken into the oxide semiconductor layer. Thus, the oxide semiconductor layer is deposited with the substrate heated at the temperature, so that the concentration of an impurity such as hydrogen, water, a hydroxyl group, or hydride contained in the oxide semiconductor layer can be sufficiently reduced. In addition, damage to the oxide semiconductor layer due to sputtering can be reduced.

An example of the deposition condition is as follows: the distance between the substrate and the target is 60 mm, the pressure is 0.4 Pa, the DC power is 0.5 kW, the substrate temperature is 400° C., and the deposition atmosphere is an oxygen atmosphere (the proportion of the oxygen flow rate is 100%). Note that a pulsed DC power source is preferable because powdery substances (also referred to as particles or dust) generated in the deposition can be reduced and variation in film thickness can be reduced.

Note that before the oxide semiconductor layer is deposited by sputtering, powdery substances (also referred to as particles or dust) which attach to a surface over which the oxide semiconductor layer is formed are preferably removed by reverse sputtering in which an argon gas is introduced and plasma is generated. The reverse sputtering is a method in which voltage is applied to a substrate and plasma is generated in the vicinity of the substrate so that a surface of the substrate side is modified. Note that instead of argon, a gas such as nitrogen, helium, or oxygen may be used.

The oxide semiconductor layer can be processed by etching after a mask with a desired shape is formed over the oxide semiconductor layer. The mask can be formed by a method such as photolithography. Alternatively, the mask may be formed by a method such as an inkjet method. Note that the etching of the oxide semiconductor layer may be either dry etching or wet etching. Needless to say, dry etching and wet etching may be employed in combination.

After that, heat treatment (first heat treatment) may be performed on the oxide semiconductor layer 144. By the heat treatment, substances including hydrogen atoms in the oxide semiconductor layer 144 are removed; thus, the structure of the oxide semiconductor layer 144 can be improved and defect levels in the energy gap can be reduced. The heat treatment is performed at 250 to 700° C., preferably 450 to 600° C. in an inert gas atmosphere. Note that the temperature of the heat treatment is preferably lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon, which is introduced into a heat treatment apparatus, is 6 N (99.9999%) or more, preferably 7 N (99.99999%) (that is, the impurity concentration is 1 ppm or lower, preferably 0.1 ppm or lower).

The heat treatment can be performed in such a manner that, for example, an object is introduced into an electric furnace in which a resistance heater or the like is used at 450° C. for 1 h in a nitrogen atmosphere. The oxide semiconductor layer 144 is not exposed to the air during the heat treatment so that entry of water or hydrogen can be prevented.

The impurities are reduced by the heat treatment so that an intrinsic (i-type) or substantially intrinsic oxide semiconductor layer is formed. Accordingly, a transistor with extremely excellent characteristics can be realized.

The heat treatment can be referred to as dehydration treatment, dehydrogenation treatment, or the like because of its advantageous effect of removing hydrogen, water, or the like. The heat treatment can be performed, for example, before the oxide semiconductor layer is processed into an island shape, after the gate insulating film is formed, or the like. Such dehydration treatment or dehydrogenation treatment may be conducted more than once.

Figure 9B:
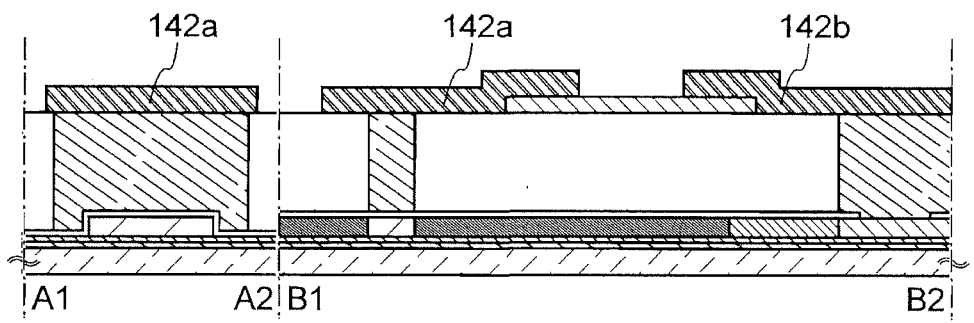

Next, a conductive layer to be a source electrode and a drain electrode (including a wiring formed using the same layer as the source electrode and the drain electrode) is formed over the oxide semiconductor layer 144 and the like and is processed, so that the source and drain electrodes 142a and 142b are formed (see FIG. 9B).

The conductive layer can be formed by PVD or CVD. As the material of the conductive layer, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

The conductive layer can have a single-layer structure or a layered structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that in the case where the conductive layer has a single-layer structure of a titanium film or a titanium nitride film, there is an advantage that the conductive layer is easily processed into the source and drain electrodes 142a and 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer may be etched so that end portions of the source and drain electrodes 142a and 142b are tapered. In that case, it is preferable that a taper angle be 30 to 60°, for example. Etching is performed so that the end portions of the source and drain electrodes 142a and 142b are tapered. Thus, coverage with the gate insulating layer 146 formed later can be improved and disconnection can be prevented.

The channel length (L) of the transistor in the upper portion is determined by a distance between a lower end portion of the source or drain electrode 142a and a lower end portion of the source or drain electrode 142b. Note that for exposure for forming a mask used at the time when a transistor with a channel length (L) of less than 25 nm is formed, it is preferable to use extreme ultraviolet rays whose wavelength is as short as several nanometers to several tens of nanometers. In the exposure by extreme ultraviolet rays, the resolution is high and the focus depth is large. Accordingly, the channel length (L) of the transistor to be formed later can be 10 nm to 1000 nm (1 µm), and the circuit can operate at higher speed. Further, the power consumption of the semiconductor device can be reduced by miniaturization.

The conductive layer 142c and the conductive layer 142d can be formed using a method and a material that are similar to those of the source and drain electrodes 142a and 142b; thus, conductive layer 142c and the conductive layer 142d illustrated in FIGS. 6A and 6B can be formed concurrently.

Figure 9C:
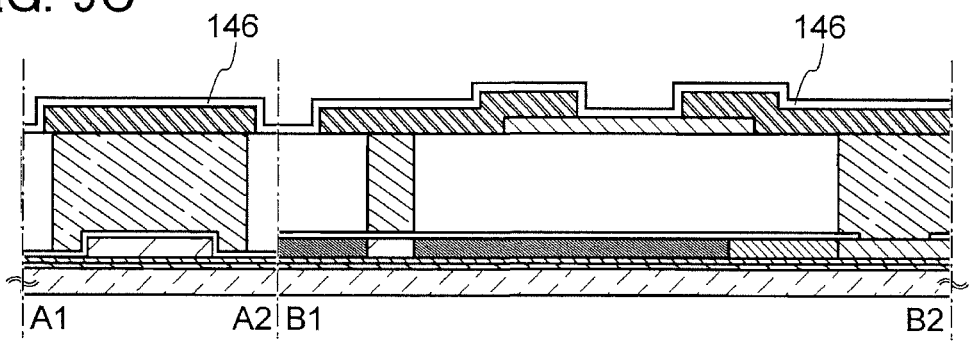

Next, the gate insulating layer 146 is formed so as to cover the source and drain electrodes 142a and 142b and to be in contact with part of the oxide semiconductor layer 144 (see FIG. 9C).

The gate insulating layer 146 can be formed by CVD, sputtering, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a layered structure in which these elements are combined. There is no particular limitation on the thickness; however, in the case where a semiconductor device is miniaturized, the thickness is preferably small in order to secure the operation of the transistor. For example, in the case where silicon oxide is used, the thickness can be 1 to 100 nm, preferably 10 to 50 nm.

When the gate insulating layer is thin as described above, gate leakage due to a tunneling effect or the like becomes problematic. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 146, electrical characteristics can be secured and the thickness can be increased in order prevent gate leakage. Note that a layered structure of a film containing a high-k material and a film containing any of silicon oxide, silicon nitride, silicon oxynitride, silicon nitride oxide, aluminum oxide, or the like may be employed.

After the gate insulating layer 146 is formed, second heat treatment is preferably performed in an inert gas atmosphere or an oxygen atmosphere. The temperature of the heat treatment is 200 to 450° C., preferably 250 to 350° C. For example, the heat treatment may be performed at 250° C. for 1 h in a nitrogen atmosphere. The second heat treatment can reduce variations in electrical characteristics of the transistor. Further, in the case where the gate insulating layer 146 includes oxygen, oxygen can be supplied to the oxide semiconductor layer 144 and oxygen vacancies in the oxide semiconductor layer 144 can be filled; thus, an intrinsic (i-type) or substantially intrinsic oxide semiconductor layer can be formed.

Note that in this embodiment, the second heat treatment is performed after the gate insulating layer 146 is formed; however, the timing of the second heat treatment is not limited to this. For example, the second heat treatment may be performed after the gate electrode is formed. Alternatively, the first heat treatment and the second heat treatment may be performed successively, the first heat treatment may serve as the second heat treatment, or the second heat treatment may serve as the first heat treatment.

At least one of the first heat treatment and the second heat treatment is performed as described above, whereby the oxide semiconductor layer 144 can be highly purified so as to contain the substances including hydrogen atoms as little as possible.

Note that oxygen doping treatment may be performed after the oxide semiconductor layer is formed, after the oxide semiconductor layer 144 is formed, or after the gate insulating layer 146 is formed. Oxygen doping is addition of oxygen (which includes at least one of an oxygen radical, an oxygen atom, and an oxygen ion) to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk.

Figure 9D:
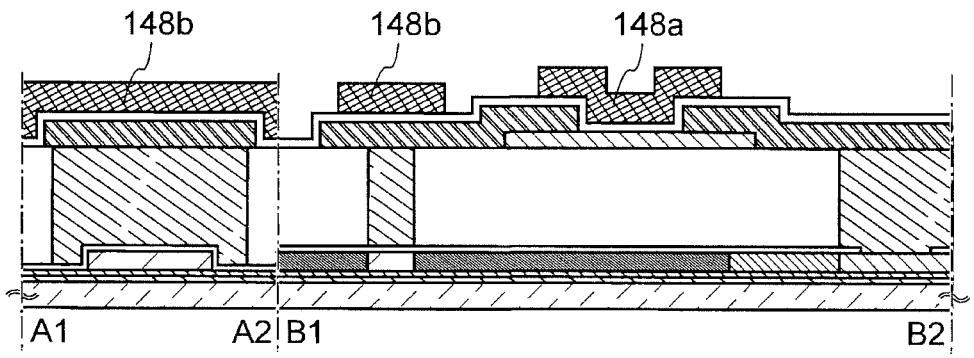

Next, a conductive layer used for forming a gate electrode (including a wiring formed using the same layer as the gate electrode) is formed and processed, so that the gate electrode 148a and the conductive layer 148b are formed (see FIG. 9D).

The oxygen doping treatment is preferably performed by an inductively coupled plasma (ICP) method with the use of oxygen plasma which is excited by a microwave (with a frequency of 2.45 GHz, for example).

The gate electrode 148a and the conductive layer 148b can be formed using a metal material such as molybdenum, titanium, tantalum, tungsten, aluminum, copper, neodymium, or scandium, or an alloy material containing any of these materials as its main component. Note that the gate electrode 148a and the conductive layer 148b may have a single-layer structure or a layered structure.

Figure 10A:
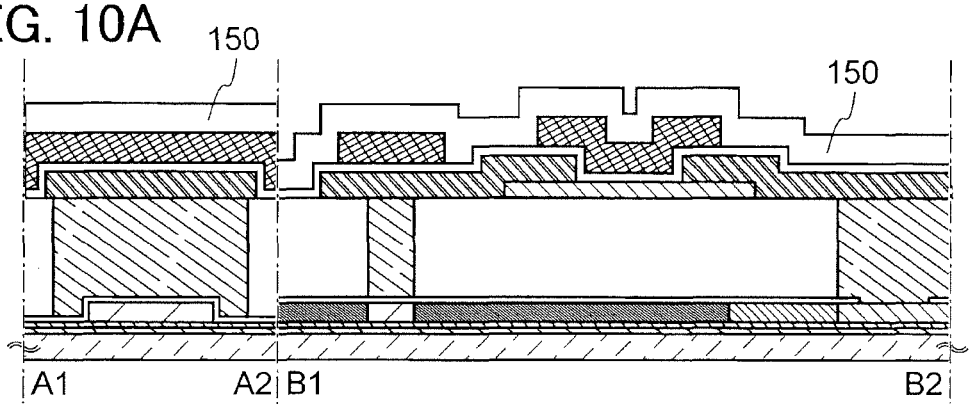
FIGS. 10A to 10C are cross-sectional views illustrating steps of manufacturing the semiconductor device.
Figure 10B:
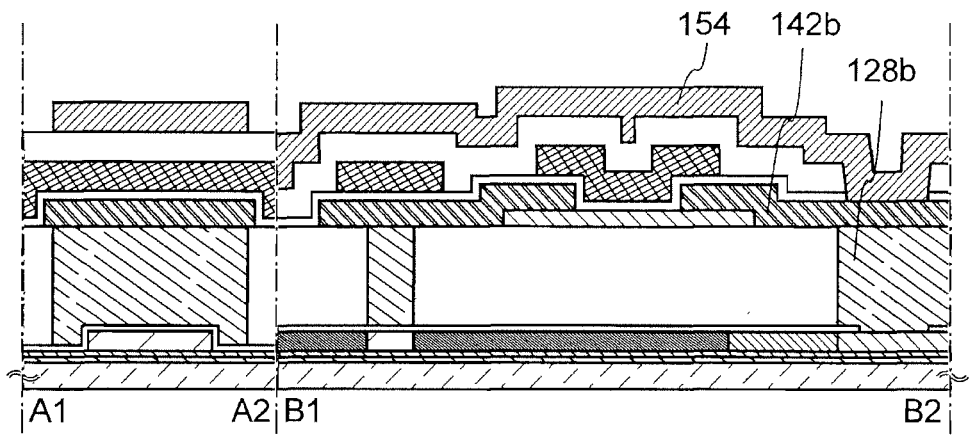

Next, the insulating layer 150 is formed over the gate insulating layer 146, the gate electrode 148a, and the conductive layer 148b (see FIG. 10A). The insulating layer 150 can be formed by PVD, CVD, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because when the insulating layer 150 has a low dielectric constant, capacitance generated between wirings, electrodes, or the like can be reduced and operation speed can be increased. Note that although the insulating layer 150 has a single-layer structure in this embodiment, one embodiment of the disclosed invention is not limited to this structure. The insulating layer 150 may have a layered structure of two or more layers.

Next, an opening reaching the source or drain electrode 142b is formed in the gate insulating layer 146 and the insulating layer 150. Then, the wiring 154 connected to the source or drain electrode 142b is formed over the insulating layer 150 (see FIG. 10B). Note that the opening is formed by selective etching using a mask or the like.

A conductive layer is formed by PVD or CVD and then is patterned, so that the wiring 154 is formed. As the material of the conductive layer, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating layer 150 by PVD and a thin titanium film (with a thickness of about 5 nm) is formed by PVD, and then, an aluminum film is formed so as to be embedded in the opening. Here, the titanium film formed by PVD has a function of reducing an oxide film (e.g., a native oxide film) formed on a surface over which the titanium film is formed, to decrease the contact resistance with the lower electrode or the like (here, the source or drain electrode 142b). In addition, hillocks of the aluminum film can be prevented. A copper film may be formed by a plating method after a barrier film of titanium, titanium nitride, or the like is formed.

The opening formed in the insulating layer 150 is preferably formed in a region overlapping with the conductive layer 128b. With provision of the opening in such a region, the increase in element area due to a contact region can be prevented.

Next, the insulating layer 156 is formed so as to cover the wiring 154. Then, an opening that reaches the conductive layer 142d in FIG. 6A is formed in the gate insulating layer 146, the insulating layer 150, and the insulating layer 156. After that, the wiring 158 is formed over the insulating layer 156 so as to overlap with the wiring 154 (see FIG. 10C and FIG. 6A). Note that the wiring 158 can be formed using a method and a material that are similar to those of the wiring 154.

Figure 10C:
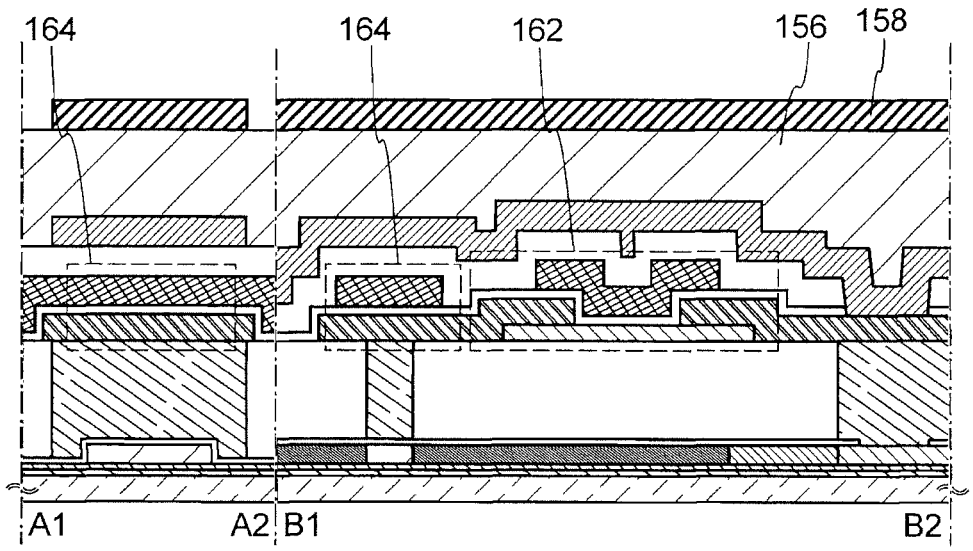

Through the steps, the transistor 162 including the highly-purified oxide semiconductor layer 144 and the capacitor 164 are completed (see FIG. 10C).

In the transistor 162 illustrated in this embodiment, the oxide semiconductor layer 144 is highly purified; thus, the hydrogen concentration is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. In addition, the carrier density of the oxide semiconductor layer 144 is sufficiently low (e.g., lower than $1 \times 10^{12}$/cm$^3$, preferably lower than 1 $45 \times 10^{10}$/cm$^3$) as compared to that of a general silicon wafer (approximately $1 \times 10^{14}$/cm$^3$). Thus, sufficiently low off-state current can be obtained. For example, the off-state current (here, current per unit channel width (1 μm)) at room temperature (25° C.) is 100 zA (1 zA (zeptoampere) is $1 \times 10^{-21}$ A) or lower, preferably 10 zA or lower.

With the use of the highly-purified and intrinsic or substantially intrinsic oxide semiconductor layer 144, the off-state current of the transistor can be sufficiently reduced. Further, with the use of such a transistor, a semiconductor device in which stored data can be retained for an extremely long time can be obtained.

When the wiring 158 is provided so as to overlap with the wiring 154, the increase in area of the wiring 158 can be suppressed. Thus, the semiconductor device illustrated in FIG. 2 can be manufactured without the decrease in integration degree of the semiconductor device. Accordingly, without the decrease in integration degree of the semiconductor device, the power consumption of the semiconductor device can be reduced and the data read performance of the semiconductor device can be improved.

As described above, the structures, methods, and the like described in this embodiment can be combined with any of the structures, methods, and the like described in the other embodiments as appropriate.

(Embodiment 3)

Next, an example of a method for forming an SOI substrate used for manufacturing the semiconductor device is described with reference to FIGS. 11A to 11H.

Figure 11A:
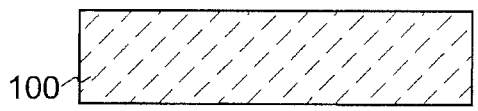
FIGS. 11A to 11H are cross-sectional views illustrating steps of manufacturing a semiconductor substrate used for manufacturing a semiconductor device.

First, the base substrate 100 is prepared (see FIG. 11A). As the base substrate 100, a substrate including an insulator can be used. Specific examples of the base substrate 100 are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Alternatively, a ceramic substrate which contains silicon nitride and aluminum nitride as its main components and whose coefficient of thermal expansion is close to that of silicon may be used.

Alternatively, a semiconductor substrate such as a single crystal silicon substrate or a single crystal germanium substrate may be used as the base substrate 100. In the case where a semiconductor substrate is used as the base substrate 100, a high-quality SOI substrate can be easily obtained because the temperature condition for heat treatment is eased as compared to the case where a glass substrate or the like is used. Here, as a semiconductor substrate, a solar grade silicon (SOG-Si) substrate or the like may be used. Alternatively, a polycrystalline semiconductor substrate may be used. In the case where an SOG-Si substrate, a polycrystalline semiconductor substrate, or the like is used, manufacturing cost can be reduced as compared to the case where a single crystal silicon substrate or the like is used.

In this embodiment, the case where a glass substrate is used as the base substrate 100 is described. When a glass substrate which can have a larger size and is inexpensive is used as the base substrate 100, cost can be reduced.

A surface of the base substrate 100 is preferably cleaned in advance. Specifically, the base substrate 100 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like. Through such cleaning treatment, for example, the surface flatness of the base substrate 100 can be improved and abrasive particles left on the surface of the base substrate 100 can be removed.

Figure 11B:
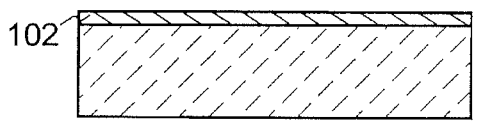
Figure 11C:
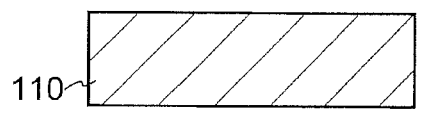

Next, the insulating layer 102 (e.g., an insulating layer containing nitrogen, such as a silicon nitride ($SiN_x$) film or a silicon nitride oxide ($SiN_xO_y$, where x>y) film) is formed over the surface of the base substrate 100 (see FIG. 11B). The insulating layer 102 can be formed by CVD, sputtering, or the like.

The insulating layer 102 formed in this embodiment corresponds to a layer for bonding a single crystal semiconductor layer (a bonding layer) in a later step. The insulating layer 102 also functions as a barrier layer for preventing an impurity contained in the base substrate 100, such as sodium (Na), from diffusing into the single crystal semiconductor layer.

As described above, since the insulating layer 102 is used as the bonding layer in this embodiment, it is preferable that the insulating layer 102 be formed to have a certain level of surface flatness. Specifically, the insulating layer 102 is formed such that it has an average surface roughness ($R_a$, which is also referred to as arithmetic mean deviation) of 0.5 nm or less and a root-mean-square surface roughness (RMS) of 0.60 nm or less, preferably an average surface roughness of 0.35 nm or less and a root-mean-square surface roughness of 0.45 nm or less. Note that for the average surface roughness or the root-mean-square surface roughness, for example, a value obtained by measurement performed on a region of 10 μm×10 μm can be used. The thickness is in the range of 10 to 200 nm, preferably, 50 to 100 nm. With the surface flatness improved as described above, the bonding defect of the single crystal semiconductor layer can be prevented.

Next, a bond substrate is prepared. Here, a single crystal semiconductor substrate 110 is used as the bond substrate (see FIG. 11C). Note that although a single crystal substrate is used as the bond substrate here, the crystallinity of the bond substrate is not necessarily limited to single crystal.

As the single crystal semiconductor substrate 110, a single crystal semiconductor substrate formed using an element that belongs to Group 14 of the periodic table, such as a single crystal silicon substrate, a single crystal germanium substrate, or a single crystal silicon germanium substrate, can be used. Alternatively, a compound semiconductor substrate formed using gallium arsenide, indium phosphide, or the like can be used. Typical examples of commercially available silicon substrates include circular silicon substrates which are 5 inches (approximately 125 mm) in diameter, 6 inches (approximately 150 mm) in diameter, 8 inches (approximately 200 mm) in diameter, 12 inches (approximately 300 mm) in diameter, and 16 inches (approximately 400 mm) in diameter. Note that the shape of the single crystal semiconductor substrate 110 is not limited to a circular shape, and the single crystal semiconductor substrate 110 may be a substrate which is processed into, for example, a rectangular shape or the like. Further, the single crystal semiconductor substrate 110 can be manufactured by a Czochralski (CZ) method or a floating zone (FZ) method.

Figure 11D:
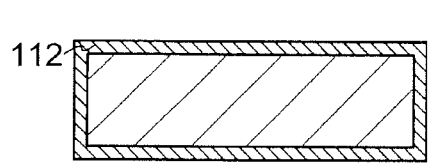

The insulating layer 112 is formed on a surface of the single crystal semiconductor substrate 110 (see FIG. 11D). In order to remove contamination, it is preferable that the surface of the single crystal semiconductor substrate 110 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like before the formation of the insulating layer 112. Alternatively, diluted hydrofluoric acid and ozone water may be discharged alternately for cleaning.

The insulating layer 112 can be formed with a single layer of a silicon oxide film, a silicon oxynitride film, or the like, or a stack of any of these films. As a method for forming the insulating layer 112, heat treatment (e.g., thermal oxidation treatment or thermal nitriding treatment), CVD, sputtering, or the like can be used. When the insulating layer 112 is formed by CVD, a silicon oxide film is preferably formed using organosilane such as tetraethoxysilane (abbreviation: TEOS, chemical formula: $Si(OC_2H_5)_4$) so that favorable bonding can be achieved.

In this embodiment, the insulating layer 112 (here, a $SiO_x$ film) is formed by thermal oxidation treatment of the single crystal semiconductor substrate 110. The thermal oxidation treatment is preferably performed in an oxidizing atmosphere to which halogen is added.

For example, thermal oxidation treatment is performed on the single crystal semiconductor substrate 110 in an oxidizing atmosphere to which chlorine (Cl) is added, so that the insulating layer 112 which is oxidized can be formed. In that case, the insulating layer 112 is a film containing chlorine atoms. By such oxidation, heavy metal (e.g., Fe, Cr, Ni, or Mo) that is an extrinsic impurity is trapped and a chloride of the metal is formed and then removed to the outside; thus, contamination of the single crystal semiconductor substrate 110 can be reduced. Further, after the single crystal semiconductor substrate 110 is bonded to the base substrate 100, an impurity from the base substrate, such as Na, can be fixed, so that contamination of the single crystal semiconductor substrate 110 can be prevented.

Note that halogen atoms contained in the insulating layer 112 are not limited to chlorine atoms. Fluorine atoms may be contained in the insulating layer 112. As a method for oxidizing the surface of the single crystal semiconductor substrate 110, a method in which the single crystal semiconductor substrate 110 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 11E:
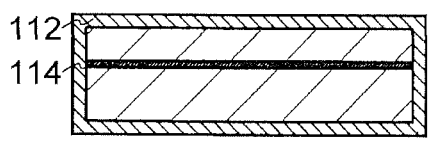
Figure 11F:
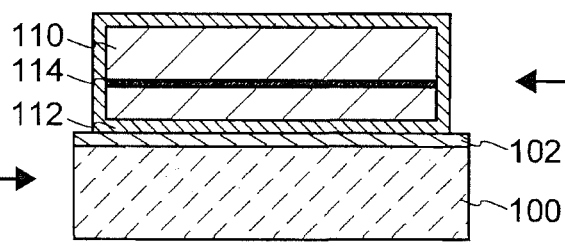

Next, ions are accelerated by an electric field, the single crystal semiconductor substrate 110 is irradiated with the ions, and the ions are added to the single crystal semiconductor substrate 110, so that a fragile region 114 where the crystal structure is damaged is formed in the single crystal semiconductor substrate 110 at a predetermined depth (see FIG. 11E).

The depth at which the fragile region 114 is formed can be adjusted by the kinetic energy, mass, electrical charge, or incidence angle of the ions, or the like. The fragile region 114 is formed at approximately the same depth as the average penetration depth of the ions. Thus, the thickness of a single crystal semiconductor layer to be separated from the single crystal semiconductor substrate 110 can be adjusted with the depth at which the ions are added. For example, the average penetration depth may be adjusted so that the thickness of a single crystal semiconductor layer is approximately 10 to 500 nm, preferably, 50 to 200 nm.

The ion irradiation treatment can be performed with an ion doping apparatus or an ion implantation apparatus. As a typical example of the ion doping apparatus, there is a non-mass-separation apparatus in which plasma excitation of a process gas is performed and an object is irradiated with all kinds of ion species generated. In this apparatus, the object is irradiated with ion species of plasma without mass separation. In contrast, an ion implantation apparatus is a mass-separation apparatus. In the ion implantation apparatus, mass separation of ion species of plasma is performed and the object is irradiated with ion species having predetermined masses.

In this embodiment, an example is described in which hydrogen is added to the single crystal semiconductor substrate 110 with the use of an ion doping apparatus. A gas containing hydrogen is used as a source gas. The proportion of $H_3^+$ is preferably set high in the ions used for irradiation.

Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case where irradiation with hydrogen and irradiation with helium are concurrently performed using an ion doping apparatus, the number of steps can be reduced as compared to the case where irradiation with hydrogen and irradiation with helium are performed in different steps, and the increase in surface roughness of a single crystal semiconductor layer to be formed later can be suppressed.

Note that heavy metal may also be added when the fragile region 114 is formed using the ion doping apparatus; however, when the ion irradiation is performed through the insulating layer 112 containing halogen atoms, contamination of the single crystal semiconductor substrate 110 due to the heavy metal can be prevented.

Then, the base substrate 100 and the single crystal semiconductor substrate 110 are disposed to face each other, and the surface of the insulating layer 102 and the insulating layer 112 are disposed in close contact with each other. Thus, the base substrate 100 and the single crystal semiconductor substrate 110 are bonded to each other (see FIG. 11F).

When bonding is performed, it is preferable that a pressure of 0.001 to 100 N/cm$^2$, preferably a pressure of 1 to 20 N/cm$^2$ be applied to one part of the base substrate 100 or one part of the single crystal semiconductor substrate 110. When the bonding surfaces are made close to each other and disposed in close contact with each other by application of pressure, bonding between the insulating layer 102 and the insulating layer 112 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 110 and the base substrate 100 are bonded to each other, surfaces to be bonded are preferably subjected to surface treatment. Surface treatment can improve the bonding strength at an interface between the single crystal semiconductor substrate 110 and the base substrate 100.

As the surface treatment, wet treatment, dry treatment, or a combination of wet treatment and dry treatment can be used. Alternatively, wet treatment may be used in combination with different wet treatment, or dry treatment may be used in combination with different dry treatment.

Note that heat treatment for increasing the bonding strength may be performed after bonding. This heat treatment is performed at a temperature at which separation at the fragile region 114 does not occur (for example, a temperature of higher than or equal to room temperature and lower than 400° C.). Alternatively, the insulating layer 102 and the insulating layer 112 may be bonded to each other while being heated at a temperature in this range. The heat treatment can be performed using a diffusion furnace, a heating furnace such as a resistance heating furnace, a rapid thermal annealing (RTA) apparatus, a microwave heating apparatus, or the like. The temperature condition is only an example, and one embodiment of the disclosed invention should not be construed as being limited to this example.

Figure 11G:
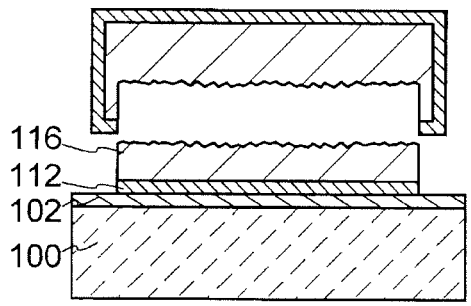

Next, heat treatment is performed for separation of the single crystal semiconductor substrate 110 at the fragile region 114, so that a single crystal semiconductor layer 116 is formed over the base substrate 100 with the insulating layer 102 and the insulating layer 112 provided therebetween (see FIG. 11G).

Note that the temperature for heat treatment in the separation is preferably as low as possible. This is because the lower the temperature in the separation is, the more surface roughness of the single crystal semiconductor layer 116 can be suppressed. Specifically, for example, the temperature for the heat treatment in the separation may be 300 to 600° C., and the heat treatment is more effective when the temperature is 400 to 500° C.

Note that after the single crystal semiconductor substrate 110 is separated, the single crystal semiconductor layer 116 may be subjected to heat treatment at 500° C. or higher so that the concentration of hydrogen remaining in the single crystal semiconductor layer 116 may be lowered.

Figure 11H:
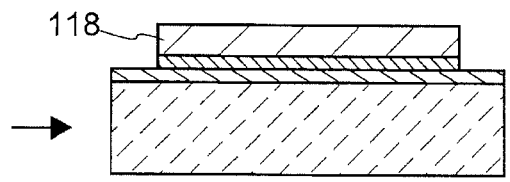

Then, the surface of the single crystal semiconductor layer 116 is irradiated with laser light, whereby a single crystal semiconductor layer 118 in which the flatness of the surface is improved and defects are reduced is formed (see FIG. 11H). Note that instead of the laser light irradiation treatment, heat treatment may be performed.

Note that although the laser light irradiation treatment is performed immediately after the heat treatment for separation of the single crystal semiconductor layer 116 in this embodiment, one embodiment of the disclosed invention should not be construed as being limited to this example. After the heat treatment for separation of the single crystal semiconductor layer 116, etching treatment may be performed so that a surface region having many defects of the single crystal semiconductor layer 116 is removed. Then, the laser light irradiation treatment may be performed. Alternatively, after the surface flatness of the single crystal semiconductor layer 116 is improved, the laser light irradiation treatment may be performed. The etching treatment may be either wet etching or dry etching. Further, in this embodiment, a step of reducing the thickness of the single crystal semiconductor layer 116 may be performed after the laser light irradiation. In order to reduce the thickness of the single crystal semiconductor layer 116, either one or both dry etching and wet etching may be employed.

Through the steps, an SOI substrate including the single crystal semiconductor layer 118 with favorable characteristics can be obtained (see FIG. 11H).

Such an SOI substrate is used as a substrate containing a semiconductor material described in Embodiment 2, so that the semiconductor device can operate at high speed.

As described above, the structures, methods, and the like described in this embodiment can be combined with any of the structures, methods, and the like described in the other embodiments as appropriate.

(Embodiment 4)

In this embodiment, applications of the semiconductor device described in any of the above embodiments to electronic devices are described with reference to FIGS. 12A to 12F. In this embodiment, applications of the semiconductor device to electronic devices such as a computer, a cellular phone handset (also referred to as a cellular phone or a cellular phone device), a personal digital assistant (including a portable game machine, an audio reproducing device, and the like), a camera such as a digital camera or a digital video camera, electronic paper, and a television set (also referred to as a television or a television receiver) are described.

Figure 12A:
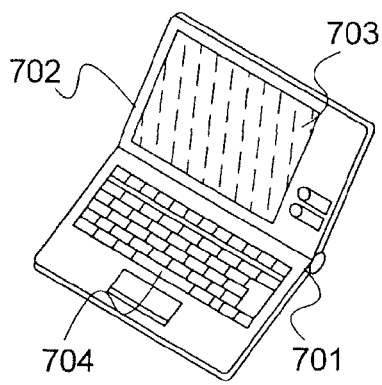
FIGS. 12A to 12F are diagrams illustrating electronic devices including semiconductor devices.

FIG. 12A is a laptop personal computer, which includes a housing 701, a housing 702, a display portion 703, a keyboard 704, and the like. The semiconductor device described in any of the above embodiments is provided in at least one of the housing 701 and the housing 702. Thus, a laptop personal computer in which data is written and read at high speed, data is retained for a long time, and power consumption is sufficiently reduced can be realized.

Figure 12D:
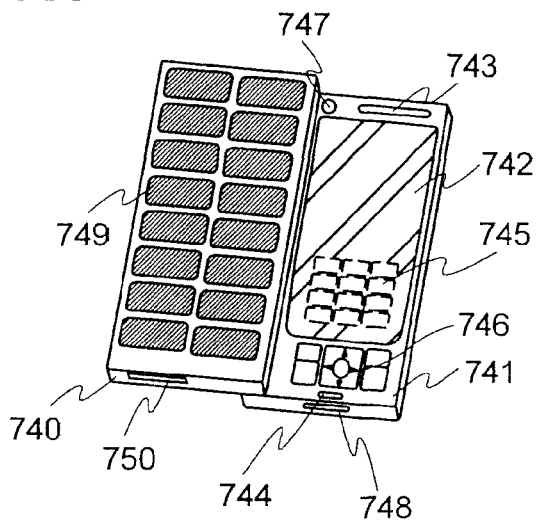
Figure 12B:
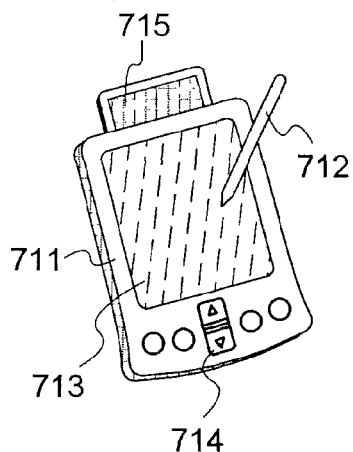

FIG. 12B is a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Thus, a personal digital assistant in which data is written and read at high speed, data is retained for a long time, and power consumption is sufficiently reduced can be realized.

Figure 12E:
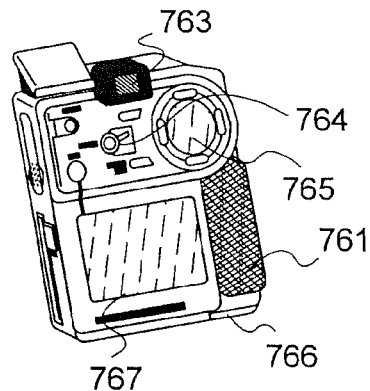
Figure 12C:
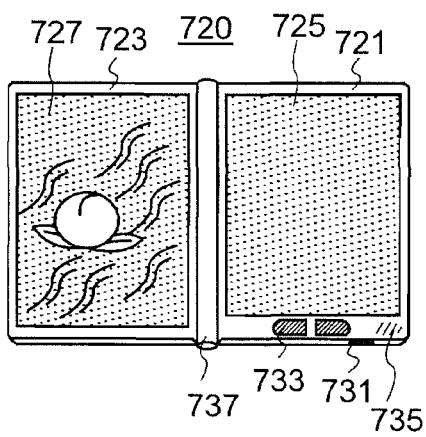

FIG. 12C is an e-book reader 720 provided with electronic paper. The e-book reader 720 has two housings 721 and 723. The housing 721 and the housing 723 include a display portion 725 and a display portion 727, respectively. The housings 721 and 723 are connected to each other by a hinge 737 and can be opened and closed with the hinge 737 used as an axis. The housing 721 is provided with a power switch 731, operation keys 733, a speaker 735, and the like. At least one of the housings 721 and 723 is provided with the semiconductor device described in any of the above embodiments. Thus, an e-book reader in which data is written and read at high speed, data is retained for a long time, and power consumption is sufficiently reduced can be realized.

FIG. 12D is a cellular phone handset, which includes two housings 740 and 741. Further, the housing 740 and the housing 741 which are developed as illustrated in FIG. 12D can overlap with each other by sliding; thus, the size of the cellular phone handset can be decreased, which makes the cellular phone handset suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for storing electricity in the cellular phone handset, an external memory slot 750, and the like. In addition, an antenna is incorporated in the housing 741. At least one of the housings 740 and 741 is provided with the semiconductor device described in any of the above embodiments. Thus, a cellular phone handset in which data is written and read at high speed, data is retained for a long time, and power consumption is sufficiently reduced can be realized.

FIG. 12E is a digital camera, which includes a main body 761, a display portion 767, an eyepiece 763, an operation switch 764, a display portion 765, a battery 766, and the like. In the main body 761, the semiconductor device described in any of the above embodiments is provided. Thus, a digital camera in which data is written and read at high speed, data is retained for a long time, and power consumption is sufficiently reduced can be realized.

Figure 12F:
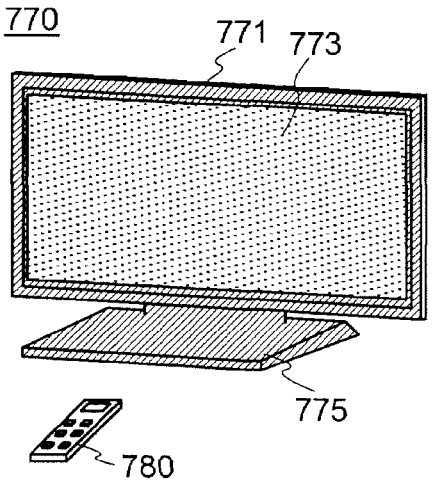

FIG. 12F is a television set 770, which includes a housing 771, a display portion 773, a stand 775, and the like. The television set 770 can be operated with an operation switch of the housing 771 or a remote control 780. The semiconductor device described in any of the above embodiments is mounted on the housing 771 and the remote control 780. Thus, a television set in which data is written and read at high speed, data is retained for a long time, and power consumption is sufficiently reduced can be realized.

As described above, the electronic devices described in this embodiment each include the semiconductor device according to any of the above embodiments. Thus, electronic devices with low power consumption can be realized.

REFERENCE NUMERALS

100: base substrate, 102: insulating layer, 110: single crystal semiconductor substrate, 112: insulating layer, 116: single crystal semiconductor layer, 118: single crystal semiconductor layer, 120: semiconductor layer, 122: insulating layer, 122a: gate insulating layer, 124: mask, 126: impurity region, 128a: gate electrode, 128b: conductive layer, 128c: gate electrode, 128d: conductive layer, 130: impurity region, 132: impurity region, 134: channel formation region, 140: insulating layer, 142a: source electrode or drain electrode, 142b: source electrode or drain electrode, 142c: conductive layer, 142d: conductive layer, 144: oxide semiconductor layer, 146: gate insulating layer, 148a: gate electrode, 148b: conductive layer, 150: insulating layer, 152: insulating layer, 154: wiring, 156: insulating layer, 158: wiring, 160: transistor, 162: transistor, 164: capacitor, 166: transistor, 180: selection transistor, 184: channel formation region, 188: impurity region, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power switch, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, 780: remote control, and 1100: memory cell.

This application is based on Japanese Patent Application serial No. 2010-162219 filed with Japan Patent Office on Jul. 16, 2010, the entire contents of which are hereby incorporated by reference.

The invention claimed is:

1. A semiconductor device comprising:
   a common bit line;
   a plurality of divided bit lines electrically connected to the common bit line;
   a source line;
   a word line;
   a signal line;
   a selection line;
   a selection transistor whose gate is electrically connected to the selection line;
   a plurality of memory cell arrays divided into a plurality of blocks every plural rows; and
   a plurality of memory cells included in each of the plurality of memory cell arrays, one of the plurality of memory cells in one of the plurality of memory cell arrays comprising:
      a first transistor including a first gate, a first source, a first drain, and a first channel formation region;
      a second transistor including a second gate, a second source, a second drain, and a second channel formation region; and
      a capacitor,
   wherein the common bit line is electrically connected to a first divided bit line of the plurality of divided bit lines through the selection transistor,
   wherein the source line is electrically connected to the first source, wherein the first divided bit line is electrically connected to the first drain and the second source,
wherein the word line is electrically connected to one electrode of the capacitor,
wherein the signal line is electrically connected to the second gate,
wherein the first gate, the second drain, and the other electrode of the capacitor are electrically connected to each other,
wherein the first channel formation region includes single crystal silicon, and
wherein the second channel formation region includes an oxide semiconductor.

2. The semiconductor device according to claim 1, wherein a channel formation region of the selection transistor includes single crystal silicon.

3. The semiconductor device according to claim 1, wherein the oxide semiconductor comprises In, Ga, and Zn.

4. The semiconductor device according to claim 1, wherein the first transistor overlaps with the second transistor.

5. The semiconductor device according to claim 1, wherein the first transistor overlaps with the second transistor and the capacitor.

6. A semiconductor device comprising:
a common bit line;
a plurality of divided bit lines electrically connected to the common bit line;
a source line;
a word line;
a first signal line;
a second signal line;
a selection line;
a selection transistor whose gate is electrically connected to the selection line;
a plurality of memory cell arrays divided into a plurality of blocks every plural rows; and
a plurality of memory cells included in each of the plurality of memory cell arrays, one of the plurality of memory cells in one of the plurality of memory cell arrays comprising:
a first transistor including a first gate, a first source, a first drain, and a first channel formation region;
a second transistor including a second gate, a second source, a second drain, and a second channel formation region; and
a capacitor,
wherein the common bit line is electrically connected to a first divided bit line of the plurality of divided bit lines through the selection transistor,
wherein the source line is electrically connected to the first source,
wherein the first divided bit line is electrically connected to the first drain,
wherein the word line is electrically connected to one electrode of the capacitor,
wherein the first signal line is electrically connected to the second gate,
wherein the second signal line is electrically connected to the second source,
wherein the first gate, the second drain, and the other electrode of the capacitor are electrically connected to each other,
wherein the first channel formation region includes single crystal silicon, and
wherein the second channel formation region includes an oxide semiconductor.

7. The semiconductor device according to claim 6, wherein a channel formation region of the selection transistor includes single crystal silicon.

8. The semiconductor device according to claim 6, wherein the oxide semiconductor comprises In, Ga, and Zn.

9. The semiconductor device according to claim 6, wherein the first transistor overlaps with the second transistor.

10. The semiconductor device according to claim 6, wherein the first transistor overlaps with the second transistor and the capacitor.

11. A semiconductor device comprising:
a first bit line;
a second bit line electrically connected to the first bit line through a first selection transistor;
a plurality of first memory cells each electrically connected to the second bit line;
a third bit line electrically connected to the first bit line through a second selection transistor; and
a plurality of second memory cells each electrically connected to the third bit line;
each of the plurality of first memory cells comprising:
a first transistor comprising a gate, a source, and a drain, wherein the source of the first transistor is electrically connected to a source line, and the drain of the first transistor is electrically connected to the second bit line;
a second transistor comprising a gate, a source, and a drain, wherein the source of the second transistor is electrically connected to the second bit line, and the gate of the second transistor is electrically connected to a first signal line; and
a first capacitor comprising a first electrode and a second electrode, wherein the first electrode of the first capacitor is electrically connected to the gate of the first transistor and the drain of the second transistor, and the second electrode of the first capacitor is electrically connected to a first word line;
each of the plurality of second memory cells comprising:
a third transistor comprising a gate, a source, and a drain, wherein the source of the third transistor is electrically connected to the source line, and the drain of the third transistor is electrically connected to the third bit line;
a fourth transistor comprising a gate, a source, and a drain, wherein the source of the fourth transistor is electrically connected to the third bit line, and the gate of the fourth transistor is electrically connected to a second signal line; and
a second capacitor comprising a first electrode and a second electrode, wherein the first electrode of the second capacitor is electrically connected to the gate of the third transistor and the drain of the fourth transistor, and the second electrode of the second capacitor is electrically connected to a second word line,
wherein a first channel formation region of the first transistor includes single crystal silicon, and
wherein a second channel formation region of the second transistor includes an oxide semiconductor.

12. The semiconductor device according to claim 11, wherein a channel formation region of the first selection transistor and a channel formation region of the second selection transistor include single crystal silicon.

13. The semiconductor device according to claim 11, wherein the oxide semiconductor comprises In, Ga, and Zn.

14. The semiconductor device according to claim 11, wherein the first transistor overlaps with the second transistor.

15. The semiconductor device according to claim 11, wherein the first transistor overlaps with the second transistor and the first capacitor.

* * * * *

UNITED STATES PATENT AND TRADEMARK OFFICE
CERTIFICATE OF CORRECTION

PATENT NO. : 8,576,636 B2
APPLICATION NO. : 13/175090
DATED : November 5, 2013
INVENTOR(S) : Kiyoshi Kato et al.

Page 1 of 1

It is certified that error appears in the above-identified patent and that said Letters Patent is hereby corrected as shown below:

In the Specifications

Column 3, line 30, replace "twins" with --terms--;

Column 10, line 57, after "line" delete ".";

Column 11, line 1, after "columns" insert --.--;

Column 13, line 52, before "selection" replace "in" with --$m$--;

Column 19, line 1, replace "SOT" with --SOI--;

Column 27, line 61, replace "1 45" with --1.45--.

Signed and Sealed this
Fifteenth Day of April, 2014

Michelle K. Lee
*Deputy Director of the United States Patent and Trademark Office*